US010942460B2

United States Patent
Mathijssen et al.

(10) Patent No.: US 10,942,460 B2
(45) Date of Patent: Mar. 9, 2021

(54) MARK POSITION DETERMINATION METHOD

(71) Applicant: ASML NETHERLANDS B.V., Veldhoven (NL)

(72) Inventors: Simon Gijsbert Josephus Mathijssen, Rosmalen (NL); Maikel Robert Goosen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/085,000

(22) PCT Filed: Feb. 14, 2017

(86) PCT No.: PCT/EP2017/053293
§ 371 (c)(1),
(2) Date: Sep. 14, 2018

(87) PCT Pub. No.: WO2017/178133
PCT Pub. Date: Oct. 19, 2017

(65) Prior Publication Data
US 2019/0086824 A1    Mar. 21, 2019

(30) Foreign Application Priority Data
Apr. 12, 2016 (EP) .................................... 16164872

(51) Int. Cl.
*G03F 9/00* (2006.01)
*G01B 11/27* (2006.01)
(52) U.S. Cl.
CPC .......... *G03F 9/7046* (2013.01); *G03F 9/7076* (2013.01); *G03F 9/7092* (2013.01);
(Continued)

(58) Field of Classification Search
CPC .... G03F 9/7046; G03F 9/7076; G03F 9/7092; G03F 9/7069; G03F 9/7088; G01B 11/272
(Continued)

(56) References Cited

U.S. PATENT DOCUMENTS

| 4,860,374 A * | 8/1989 | Murakami ................ G03F 9/70 |
| | | 382/151 |
| 6,421,124 B1 * | 7/2002 | Matsumoto ............. G03F 9/703 |
| | | 356/401 |

(Continued)

FOREIGN PATENT DOCUMENTS

| JP | 1012530 | 1/1998 |
| WO | 2009150089 | 12/2009 |

(Continued)

OTHER PUBLICATIONS

International Search Report and Written Opinion issued in corresponding PCT Patent Application No. PCT/EP2017/053293, dated Jun. 23, 2017.

(Continued)

*Primary Examiner* — Isiaka O Akanbi
(74) *Attorney, Agent, or Firm* — Pillsbury Winthrop Shaw Pittman LLP

(57) ABSTRACT

A method of determining positions of marks, the marks comprising periodic structures, at least some of the structures comprising periodic sub-structures, the sub-structures having a smaller period than the structures, the marks formed with positional offsets between the sub-structures and structures, the positional offsets caused by a combination of both known and unknown components, the method comprising illuminating a plurality of the marks with radiation having different characteristics, detecting radiation diffracted by the marks using one or more detectors which produce output signals, discriminating between constituent (Continued)

parts of the signals, the discriminating based on a variation of the signals as a function of spatial positions of the marks on a substrate, selecting at least one of the constituent parts of the signals, and using the at least one selected constituent part, and information relating to differences between the known components, to calculate a corrected position of at least one mark.

21 Claims, 10 Drawing Sheets

(52) U.S. Cl.
CPC .......... *G01B 11/272* (2013.01); *G03F 9/7069* (2013.01); *G03F 9/7088* (2013.01)

(58) Field of Classification Search
USPC .................................................. 356/399–401
See application file for complete search history.

(56) References Cited

U.S. PATENT DOCUMENTS

| | | | |
|---|---|---|---|
| 6,521,385 B2 * | 2/2003 | Yoshida | G03F 9/7076 250/491.1 |
| 6,870,623 B2 | 3/2005 | Tanaka et al. | |
| 6,961,116 B2 | 11/2005 | Den Boef et al. | |
| 7,864,308 B2 * | 1/2011 | Sato | G03F 9/7026 355/53 |
| 8,477,310 B2 * | 7/2013 | Kobayashi | G03F 9/7003 356/401 |
| 8,482,732 B2 * | 7/2013 | Dohse | G03F 7/70791 356/400 |
| 8,797,554 B2 | 8/2014 | Straaijer | |
| 8,982,347 B2 | 3/2015 | Wei et al. | |
| 2003/0021467 A1 | 1/2003 | Adel et al. | |
| 2003/0053060 A1 * | 3/2003 | Kim | H01L 23/544 356/401 |
| 2004/0223157 A1 | 11/2004 | Nakajima | |
| 2005/0036144 A1 * | 2/2005 | Suzuki | G03F 9/7092 356/401 |
| 2009/0195768 A1 | 8/2009 | Bijnen et al. | |
| 2011/0027704 A1 | 2/2011 | Cramer et al. | |
| 2011/0255066 A1 * | 10/2011 | Fuchs | G03F 7/70633 355/67 |
| 2011/0317163 A1 | 12/2011 | Lee et al. | |
| 2012/0212749 A1 | 8/2012 | Den Boef et al. | |
| 2013/0141723 A1 | 6/2013 | Wei et al. | |
| 2013/0250284 A1 * | 9/2013 | Lienhart | G01B 11/272 356/138 |
| 2015/0109624 A1 | 4/2015 | Kreuzer et al. | |
| 2015/0227061 A1 | 8/2015 | Tinnemans et al. | |
| 2015/0355554 A1 * | 12/2015 | Mathijssen | G03F 9/7092 355/67 |

FOREIGN PATENT DOCUMENTS

| | | |
|---|---|---|
| WO | 2014068116 | 5/2014 |
| WO | 2014146906 | 9/2014 |
| WO | 2015062854 | 5/2015 |
| WO | 2017009036 | 1/2017 |
| WO | 2017060054 | 4/2017 |
| WO | 2017093256 | 6/2017 |

OTHER PUBLICATIONS

Huijbregtse, Jeroen, et al.: "Overlay Performance with Advanced ATHENA Alignment Strategies", Proc. of SPIE, vol. 5038, 2003, pp. 918-928.

Megens, Henry, et al.: "Advances in Process Overlay—Alignment Solutions for Future Technology Nodes", Proc. of SPIE, vol. 6518, 2007, pp. 65181Z-1-65181Z-12.

* cited by examiner $T_{ACQ} = L / v_W$ (a)

(b)

MARK POSITION DETERMINATION METHOD

CROSS-REFERENCE TO RELATED APPLICATIONS

This application is the U.S. national phase entry of PCT patent application no. PCT/EP2017/053293, which was filed on Feb. 14, 2017, which claims the benefit of priority of European patent application no. 16164872.0, which was filed on Apr. 12, 2016, and which is incorporated herein in its entirety by reference.

FIELD

The present invention relates to a method of determining the positions of marks (e.g. alignment marks) on a substrate. The method may be performed using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, marks are provided on the substrate, and the lithographic apparatus includes one or more alignment sensors by which positions of marks on a substrate can be measured accurately. These alignment sensors are effectively position measuring apparatuses.

Different types of marks and different types of sensors are known e.g. are provided by different manufacturers. The marks may be referred to as alignment marks.

There is continually a need to provide more accurate position measurements, especially to control position errors as product features get smaller and smaller. One cause of error in alignment accuracy is sensitivity of the position sensor to sub-resolution features present in the mark. To explain, marks are generally formed of gratings with features far larger than the features of the device pattern which is to be applied to the substrate in the lithographic apparatus. The required positioning accuracy is therefore obtained not by the fineness of the alignment grating, but rather by the fact that it provides a periodic signal that can be measured over many periods, to obtain overall a very accurate position measurement. On the other hand, a very coarse grating is not representative of the actual product features, and therefore its formation is subject to different processing effects than the actual product features. Therefore it is customary for the coarse grating of the mark to be made up of finer product-like features. These finer gratings are examples of the "sub-resolution" features referred to above, being too fine to be resolved by the alignment sensor. They may be referred to more commonly as "at-resolution" features, however, by reference to the resolving power of the patterning system in the lithographic apparatus.

The marks are typically applied to the substrate at an early stage in a device manufacturing process, using a lithographic apparatus similar or even identical to the one which will apply the patterns for subsequent product layers. The at-resolution features become subject to slightly different errors in their positioning than the coarser alignment grating features, for example due to aberrations in an optical projection system used to apply the pattern. The effect of this in current alignment sensors is that the measured position contains unknown errors, being neither the position of the coarse grating nor that of the finer at-resolution grating. It has further been found that, depending on the colour and polarization used in the position measurement, the error in the reported position caused by a mismatch in position between the coarse and fine gratings can be much greater than the mismatch itself.

SUMMARY

According to a first aspect of the invention, there is provided a method of determining positions of marks on a substrate, the marks comprising structures arranged periodically in at least a first direction, at least some of the structures comprising periodic sub-structures, the sub-structures having a smaller period than the structures, the marks being formed with positional offsets between the sub-structures and the structures, the positional offsets being caused by a combination of both known and unknown components, the method comprising illuminating a plurality of the marks with radiation and detecting radiation which is diffracted by the marks which has different characteristics using one or more detectors which produce output signals, processing the signals, wherein the processing comprises discriminating between constituent parts of the signals, the discriminating being based on a variation of the signals as a function of spatial positions of the marks on the substrate, selecting at least one of the constituent parts of the signals, and using the at least one selected constituent part of the signals, and information relating to differences between the known components, to calculate a corrected position of at least one mark.

This method advantageously provides an accurate determination of the position of at least one mark on a substrate. Discrimination and subsequent selection of the constituent parts of the signals advantageously reduces the extent that the determination of the position of the at least one mark is negatively affected by substrate processing errors such as, for example, etching and/or chemical mechanical polishing, which are not known in advance and may vary over the substrate and from substrate to substrate. The method may be used to provide an accurate measurement of the position of the mark with respect to a reference frame of a lithographic apparatus.

A constituent part of the signals that is not selected may comprise a part of the signals which has a lower frequency variation as a function of spatial position than the selected at least one constituent part of the signals.

An apparent positional offset between mark sub-structures and structures caused by substrate processing errors has a lower frequency variation as a function of spatial position on the substrate compared to an actual positional offset caused by projection errors such as, for example, optical aberrations when the mark was formed. Discriminating and selecting constituent parts of the signals based upon a spatial frequency variation of the signals therefore advantageously allows unwanted signals that may negatively affect the accuracy of the position measurement to be discriminated and omitted from a calculation used to determine the positional offset between the mark sub-structures and structures. This allows a corrected position of the mark to be calculated more accurately.

The at least one selected constituent part of the signals used in the calculation may comprise a part of the signals which has a higher spatial frequency variation than a constituent part of the signals that is not selected.

The positional offset caused by projection errors gives rise to a higher frequency variation of the measured mark position as a function of spatial position on the substrate compared to the apparent positional offset caused by substrate processing errors. Selecting the part of the signals which has a higher spatial frequency variation therefore advantageously allows parts of the signals that improve the accuracy of the determination of the position of the at least one mark to be discriminated, selected and used in the calculation used to correct the position of one or more marks.

The method may further comprise performing a validation, the validation comprising comparing constituent parts of signals that were not selected, the signals originating from radiation diffracted from marks which are adjacent to each other.

Performing the validation advantageously provides a check to verify if an assumption made in relation to the positional offsets of the mark sub-structures and structures is accurate. The word "adjacent" may be interpreted as indicating that the marks used in the validation are a pair of marks that are closest to each other in a given direction along the substrate. The word "adjacent" may be interpreted as indicating that the marks used in the validation are within several hundred micrometers of each other.

The processing may comprise applying principal component analysis or independent component analysis or blind signal separation or polynomial fitting to the signals.

Applying statistical analysis techniques such as principal component analysis or independent component analysis or blind signal separation or polynomial fitting advantageously allows the constituent parts of the signals that improve the accuracy of the determination of the position of the at least one mark to be discriminated, selected and used in a calculation used to determine the positional offset between the mark sub-structures and structures, and thus calculate a corrected position of the mark. Constituent parts of the signals that may negatively affect the accuracy of the position measurement may be omitted from the calculation.

The calculation may use a relationship between the output signals and the positional offsets of the marks.

A relationship exists between the positional offset between the mark sub-structures and structures of the marks and information relating to the positions of the marks that is contained within output signals of a detector. This relationship may advantageously be exploited to determine the positional offset, and thus calculate a corrected position of at least one mark.

The relationship may have the same form for radiation beams having different characteristics.

The relationship may advantageously be exploited to combine measurements of the obtained position of a mark using radiation beams having different characteristics, and thereby determine a centre position of the structures of a mark and/or a centre position of the sub-structures of the mark and/or the positional offset between the sub-structures and structures of the mark. This enables a calculation of a corrected position of the mark.

The relationship may be a linear relationship.

A linear relationship exists between information relating to the positions of the marks that is contained within output signals of a detector and the positional offsets of the marks. The observation of linearity between the positional offsets of the marks and the position measurements performed using radiation beams having different characteristics may advantageously be exploited to determine a position of the mark that has been corrected for the positional offset between the sub-structures and structures of the mark.

The different characteristics of the diffracted radiation may be provided by illuminating the plurality of marks with radiation comprising different wavelengths or different polarizations.

Performing position measurements of the marks using radiation beams having different wavelengths or different polarizations advantageously allows the linear relationship that exists between information relating to the positions of the marks that is contained within output signals of a detector, and the positional offsets of the marks, to be determined. This relationship can be exploited in order to calculate a corrected position of at least one mark.

The different characteristics of the diffracted radiation may be provided by illuminating the plurality of marks with different off-axis radiation beams and/or by detecting different diffraction orders.

Performing position measurements of the marks using different off-axis radiation beams and by detecting different diffraction orders advantageously allows the linear relationship that exists between information relating to the positions of the marks that is contained within output signals of a detector, and the positional offsets of the marks, to be determined. This relationship can be exploited in order to calculate a corrected position of at least one mark. Alternatively, only the diffracted radiation is used to select the different diffraction orders. In an embodiment the one or more detectors comprise an image sensor. The image sensor advantageously provides for detecting asymmetry of intensity signals for the different diffracted orders.

At least one selected constituent part of the signals may comprise a part of the signals with spatial variations associated with a radiation exposure path across the substrate.

The positional offsets of the marks caused by projection errors during formation of the marks on the substrate may be associated with a radiation exposure path used to form the marks. Constituent parts of the signals that may be used to improve the accuracy of the position measurement may be associated with a radiation exposure path across the substrate. Constituent parts of the signals having spatial variations associated with a radiation exposure path across the substrate may advantageously be discriminated, selected and used to calculate a corrected position of the mark.

According to a second aspect of the invention, there is provided a lithographic apparatus comprising a patterning subsystem for transferring a pattern to a substrate, a measuring subsystem for measuring positions of said substrate in relation to the patterning subsystem, wherein the patterning subsystem is arranged to use the positions measured by the measuring subsystem to apply said pattern at a desired position on the substrate and wherein the measuring subsystem is arranged to position the applied pattern by reference to measured positions of marks provided on the substrate and wherein the measuring subsystem is arranged to calculate said measured positions of said marks by a method as recited by the first aspect of the invention or any of its abovementioned options.

This lithographic apparatus advantageously provides accurate positioning of a pattern that is to be applied to a substrate by use of the method(s) introduced above.

According to a third aspect of the invention, there is provided a method of manufacturing devices wherein a device pattern is applied to a substrate using a lithographic process, the method including positioning the applied pattern by reference to measured positions of one or more marks formed on the substrate, the measured positions being obtained by a method as recited by the first aspect of the invention or any of its abovementioned options.

This method of manufacturing devices advantageously provides accurate positioning of a pattern that is to be applied to a substrate by use of the method(s) introduced above.

According to a fourth aspect of the invention, there is provided an apparatus for determining positions of marks on a substrate, the apparatus comprising an optical system configured to illuminate a plurality of marks with radiation and detect radiation which is diffracted by the marks and which has different characteristics using one or more detectors which produce output signals, a processor configured to calculate a corrected position of at least one mark using signals from a plurality of marks, the marks comprising structures arranged periodically in at least a first direction, at least some of the structures comprising periodic sub-structures, the sub-structures having a smaller period than the structures, the marks being formed with positional offsets between the sub-structures and the structures, the positional offsets being caused by a combination of both known and unknown components, the processor being yet further configured to discriminate between constituent parts of the signals, the discriminating being based on a variation of the signals as a function of spatial positions of the marks on the substrate, the processor being configured to select at least one of the constituent parts of the signals and use the at least one selected constituent part of the signals, and information relating to differences between the known components, to calculate the corrected position of the at least one mark.

This apparatus advantageously provides an accurate determination of the position of at least one mark on a substrate. Discrimination and subsequent selection of the constituent parts of the signals advantageously reduces the extent that the position measurement of the at least one mark is negatively affected by substrate processing errors such as, for example, etching and/or chemical mechanical polishing. The apparatus may be used to provide an accurate measurement of the position of at least one mark with respect to a reference frame of a lithographic apparatus.

According to a fifth aspect of the invention, there is provided a computer program product comprising machine-readable instructions for causing a processing device to perform the calculation recited by the first aspect of the invention or any of its abovementioned options, or for causing a lithographic apparatus to perform the method recited by the first aspect of the invention or any of its abovementioned options, or for causing a measurement apparatus to perform the method recited by the first aspect of the invention or any of its abovementioned options.

This computer program product advantageously enables a variety of different apparatus to provide an accurate determination of the position of at least one mark on a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
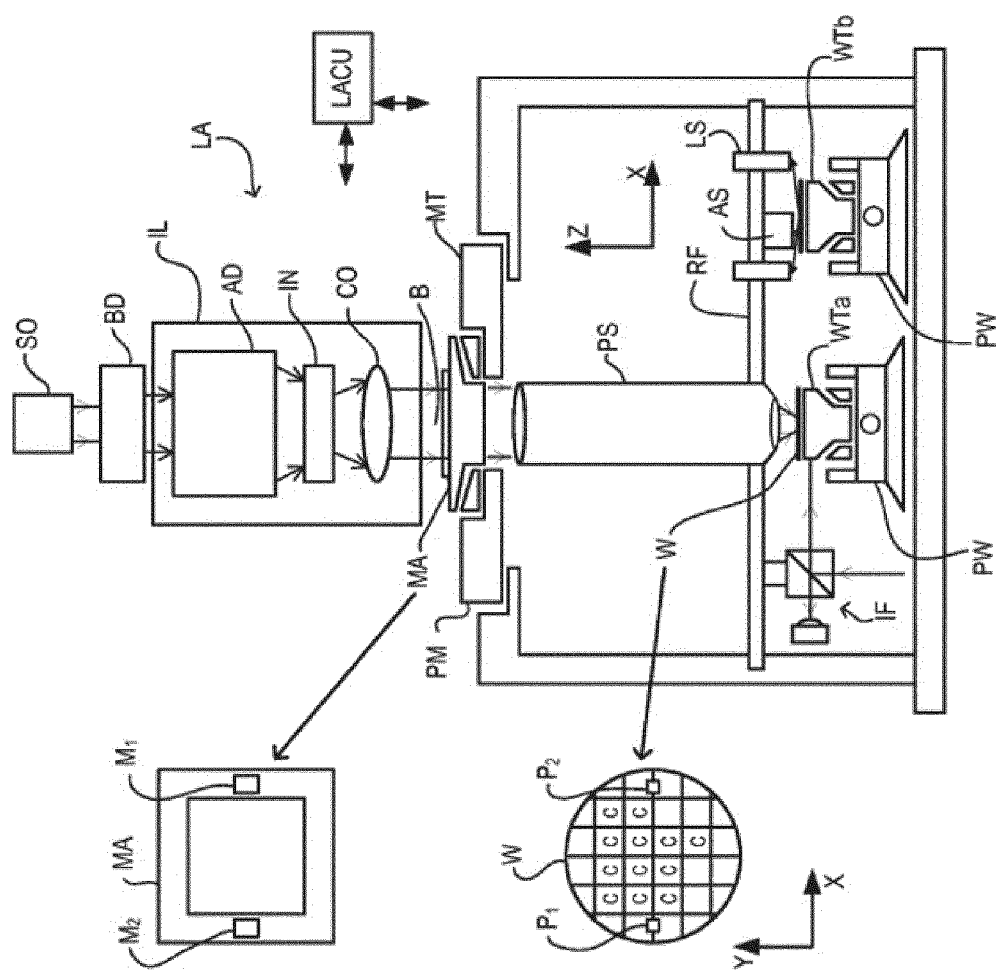
FIG. 1 schematically depicts a lithographic apparatus and an alignment system according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support may use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to one embodiment of the invention. The apparatus comprises:
- an illumination system (illuminator) IL configured to condition a radiation beam B (e.g. UV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator IL may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate marks P1, P2. Although the substrate marks as illustrated occupy dedicated target portions, they may be located in spaces between target portions (these are known as scribe-lane marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes a programmable patterning device, such as a programmable mirror array of a type as referred to above.

Combinations and/or variations of the above described modes of use or entirely different modes of use may also be employed.

The illustrated lithographic apparatus LA is of a so-called dual stage type which has two substrate tables WTa and WTb and two stations—an exposure station and a measurement station—between which the substrate tables may be exchanged. While one substrate on one substrate table is being exposed at the exposure station, another substrate may be loaded onto the other substrate table at the measurement station so that various preparatory steps may be carried out. The preparatory steps may include mapping the surface of the substrate using a level sensor LS and measuring the position of marks on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all of the movements and measurements of the various actuators and sensors described. LACU also includes signal processing and data processing capacity to implement desired calculations relevant to the operation of the apparatus. In practice, control unit LACU may be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
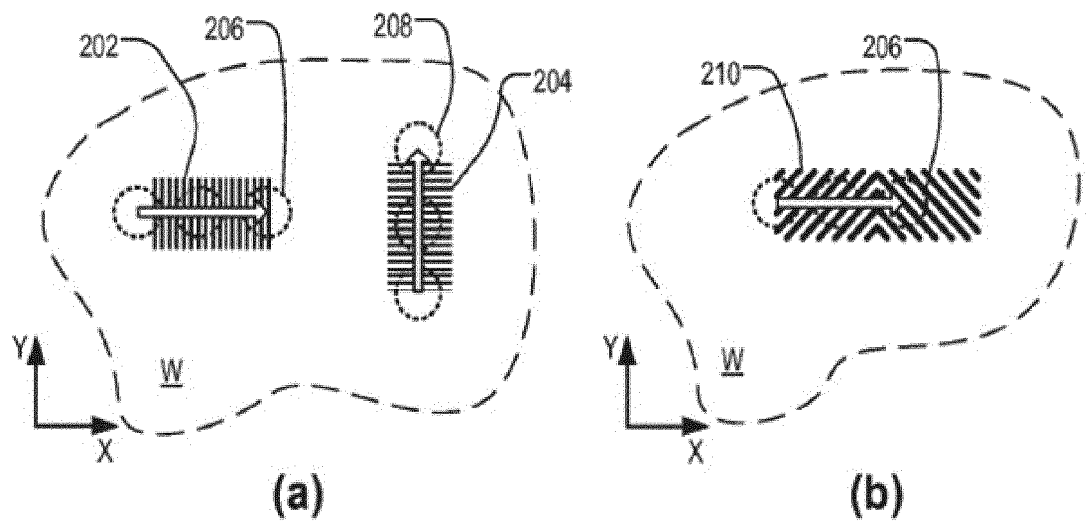
FIG. 2, comprising FIG. 2(a) and FIG. 2(b), schematically depicts various forms of a mark that may be provided on a substrate in the apparatus of FIG. 1.

FIG. 2(a) shows examples of marks 202, 204, provided on substrate W for the measurement of X-position and Y-position, respectively. Each mark in this example comprises a series of bars formed in a product layer or other layer applied to or etched into the substrate. The bars are regularly spaced and act as grating lines so that the mark may be regarded as a diffraction grating with a sufficiently well-known spatial period (pitch). The bars on the X-direction mark 202 are parallel to the Y-axis to provide periodicity in the X direction, while the bars of the Y-direction mark 204 are parallel to the X-axis to provide periodicity in the Y direction. The alignment sensor AS (shown in FIG. 1) scans each mark optically with a spot 206 (X direction), 208 (Y direction) of radiation, to obtain a periodically-varying signal, such as a sine wave. The phase of this signal is analysed, to measure the position of the mark, and hence of substrate W, relative to the alignment sensor, which in turn is fixed relative to the reference frame RF of the apparatus.

The term "mark" may be interpreted as including alignment marks (i.e. marks used to measure the position of the substrate relative to a reference frame of the lithographic apparatus) or overlay marks, such as overlay target grating (i.e. marks used to measure the alignment or mismatch between (features) on two (or more) layers on the substrate). The term "position" may be interpreted as including a position relative to the reference frame of the lithographic apparatus.

Measuring the position of the marks may provide information on a deformation of the substrate on which the marks are formed. Deformation of the substrate may occur by, for example, electrostatic clamping of the substrate to the substrate table and/or heating of the substrate when the substrate is exposed to radiation. Other sources of substrate deformation are possible.

The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches may also be used for this purpose. These techniques are again well known to the person skilled in the art, and will not be detailed herein. The design and operation of such sensors is well known in the art, and each lithographic apparatus may have its own design of sensor. For the purpose of the present description, it will be assumed that the alignment sensor AS is generally of the form described in U.S. Pat. No. 6,961,116 (den Boef et al). FIG. 2(b) shows a modified mark for use with a similar alignment system, which X- and Y-positions can be obtained through a single optical scan with the illumination spot 206 or 208. The mark 210 has bars arranged at 45 degrees to both the X- and Y-axes. This combined X- and Y-measurement may be performed using the techniques described in published patent application US 2009/195768 A (Bijnen et al).

Figure 3:
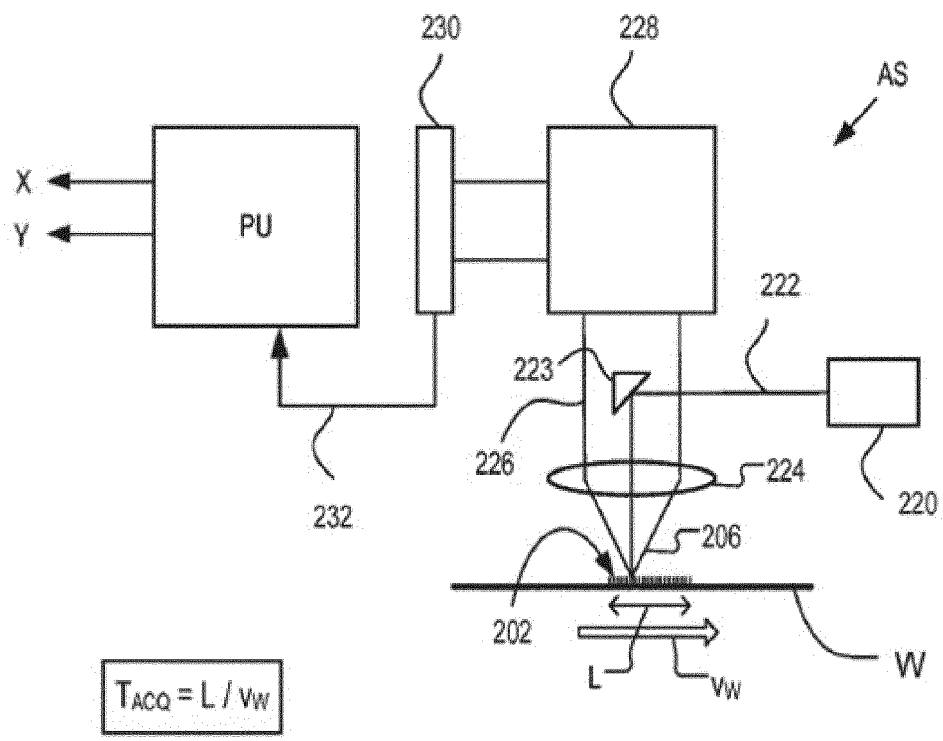
FIG. 3 is a schematic block diagram of a known alignment sensor scanning a mark in the apparatus of FIG. 1.

FIG. 3 is a schematic block diagram of a known alignment sensor AS. Illumination source 220 provides a beam 222 of radiation of one or more wavelengths, which is diverted by a spot mirror 223 through an objective lens 224 onto a mark, such as mark 202, located on substrate W. As indicated schematically in FIG. 2, in the example of the present alignment sensor based on U.S. Pat. No. 6,961,116 mentioned above, the illumination spot 206 by which the mark 202 is illuminated may be slightly smaller in diameter than the width of the mark itself.

Radiation diffracted by the mark 202 is picked up by an objective lens 224 and collimated into an information-carrying beam 226. The term "diffracted" is intended to include zero-order diffraction from the mark (which may be referred to as reflection). A self-referencing interferometer 228 is of the type disclosed in U.S. Pat. No. 6,961,116 mentioned above, and processes beam 226 and outputs separate beams (for each wavelength) onto a sensor array 230. The spot mirror 223 serves conveniently as a zero-order stop at this point, so that the information carrying beam 226 comprises only higher order diffracted radiation from the mark 202 (this is not essential to the measurement, but improves signal to noise ratios). Intensity signals 232 from individual sensors in a sensor grid 230 are provided to a processing unit PU. By a combination of optical processing in the block 228 and computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and demultiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to mark asymmetry.

Referring to the measurement process in more detail, an arrow labelled Vw in FIG. 3 illustrates a scanning velocity with which spot 206 traverses a length L of the mark 202. In this example, the alignment sensor AS and spot 206 remain stationary, while it is the substrate W that moves with velocity Vw. The alignment sensor can thus be mounted rigidly and accurately to the reference frame RF (see FIG. 1), while effectively scanning the mark 202 in a direction opposite to the direction of movement of substrate W. The substrate W is controlled in this movement by its mounting on the substrate table WT and the substrate positioning system PW. All movements shown are parallel to the X axis. Similar actions apply for scanning the mark 204 with spot 208 in the Y direction.

As discussed in the published patent application US 2012-0212749 A1, the high productivity requirements required of the lithographic apparatus require the measurement of the marks at numerous positions on the substrate to be performed as quickly as possible, which implies that the scanning velocity Vw is relatively fast, and a time TACQ available for acquisition of each mark position is correspondingly short. In simplistic terms, the formula TACQ=L/Vw applies. The prior application US 2012-0212749 A1 describes a technique to impart an opposite scanning motion of the spot, so as to lengthen the acquisition time. The same scanning spot techniques can be applied in sensors and methods of the type disclosed herein, if desired.

Figure 4:
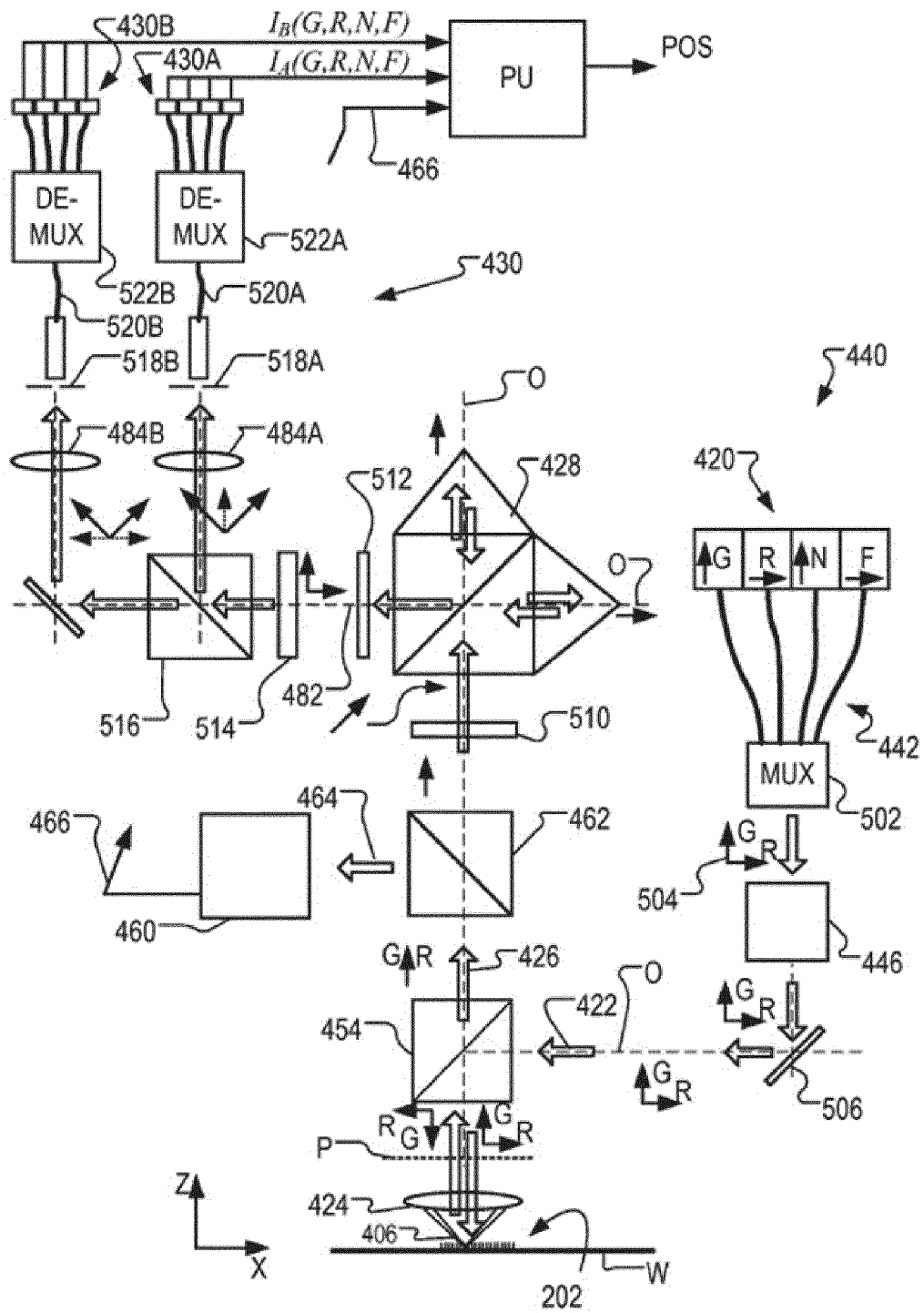
FIG. 4 is a schematic diagram of a modified alignment sensor suitable for use in an embodiment of the present invention and useable as the alignment sensor in the apparatus of FIG. 1, including off-axis illumination and an optional asymmetry measuring arrangement (not shown in detail) and further showing features of multiple wavelengths and polarization.

FIG. 4 illustrates an optical system of an alignment sensor that is a modified version of one described in the prior publications U.S. Pat. No. 6,961,116 and US 2009/195768 A mentioned above. This introduces the option of off-axis illumination modes which, among other things, allow a reduced pitch of the mark for greater accuracy. The optical system may also allow scatterometry type measurements to be performed with the alignment sensor, rather than with a separate scatterometer instrument, for example for measuring overlay. In FIG. 4, for simplicity the details of providing off-axis and on-axis modes of illumination are omitted. For the present disclosure it is more interesting to show details of the multiple wavelengths and polarizations.

An optical axis O which has several branches is indicated by a broken line running throughout the optical system 400. For ease of comparison with the schematic diagram of FIG. 3, some parts of the optical system 400 are labelled with reference signs similar to those used in FIG. 3, but with prefix "4" instead of "2". Thus, we see a light source 420, an illumination beam 422, an objective lens 424, an information carrying beam 426, a self-referencing interferometer 428 and a detector arrangement 430. Signals from the detector arrangement are processed by processing unit PU, which is modified so as to implement the novel features described below and to output an (improved) position measurement POS for each mark.

Additional components illustrated in this more detailed schematic diagram are as follows. In an illumination subsystem 440, radiation from source 420 is delivered via optical fibres 442 to an illumination profiling optics 446. This delivers input beam 422 via beam splitter 454 to objective lens 424 having a pupil plane P. Objective lens 424 forms a spot 406 on the mark 202, 204, 210 on the wafer W. Information-carrying beam 426, diffracted by the mark, passes through beam splitter 454 to interferometer 428. Interferometer 428 splits the information carrying beam into two parts with orthogonal polarization, rotates these parts about the optical axis by 180° relative to one another, and combines these into an outgoing beam 482. The outgoing beam 482 enters the detector arrangement 430 as will be described in more detail below.

Included in the present example is an asymmetry measuring arrangement 460. Asymmetry measuring arrangement 460 receives a part 464 of the information carrying beam 426 through a second beam splitter 462 positioned in advance of the interferometer. Another patent application, US20150227061, describes techniques for the measurement of asymmetry using position information obtained through the detector 430. In principle, a dedicated asymmetry measuring arrangement 460 could be eliminated.

Illumination profiling optics 446 can take various forms, some of which are disclosed in more detail in prior patent application US 2015109624. In the examples disclosed therein, alignment sensors (more generally, position measuring apparatuses) are shown which allow the use of reduced grating pitches without the need for spatial resolution on the detector side. By use of illumination modes, these apparatuses are able to measure the positions of marks with a wide range of different pitches, for example from less than 1 μm to pitches of 20 μm, without changing the current detector design. A particular feature common to the examples described in the prior application US 2015109624, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the mark from substantially λ/NA to substantially λ/2NA, where λ is the wavelength of radiation used, and NA is the numerical aperture of an objective lens of the instrument (e.g. the alignment sensor or more generally the position measuring apparatus). The examples described in the prior application US 2015109624, also use a particular distribution of spot mirrors in a beam splitter of the apparatus, which can both provide the desired illumination and act as a field stop for zero-order diffracted radiation. A 'universal' illumination profile can be designed that allows for aligning on any of the X, Y and XY marks without changing the illumination mode, although this inevitably brings some compromise in performance and/or some complication in the apparatus. Alternatively, dedicated modes can be designed and made to be selectable for use with the different mark types. Different polarizations of illumination can be selected also.

The apparatus as a whole need not be limited to provide these particular off-axis illumination profiles. It may have other modes of use, both known or yet to be developed, which favour the use of different profiles. For example, the apparatus may provide for selection of on- and off-axis illumination modes for the different mark types shown in FIGS. 2(a) and (b). While off-axis illumination is of interest for use with finer gratings, an on-axis illumination profile may be useful for compatibility with existing marks and measurement methods. Referring firstly to the example of an on-axis mode, as used in the known sensor of FIG. 3, illumination normal to the substrate is provided by an on-axis illumination profile having a central bright spot within an otherwise dark pupil. This profile is an optional setting in the illumination beam 422 of the apparatus. In this example, it is desired for the zero-order radiation beam which returns along the optical axis to be blocked before entry into the interferometer 428, but also for it to be transferred to the asymmetry measuring arrangement 460 (when provided). To block the zero-order before the interferometer 428 is not essential, but improves the signal to noise ratio of the position signal. Accordingly, in this embodiment, a spot mirror may be included in the second beam splitter 462. The first splitter 454 is not silvered, and one accepts that only 50% or so of the intensity of the central spot is transferred to the mark. In an alternative embodiment, where the arrangement 460 is omitted, this profile may be produced directly by illumination profiler 446 and transmitted at full intensity to objective 424 by a spot mirror within the first beam splitter 454. A variety of alternatives can be envisaged to obtain a desired profile.

Off-axis illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be very short. Even with a monochromatic laser source, U.S. Pat. No. 6,961,116 teaches that a short coherence time is preferred, for example to eliminate interference from undesired multiple reflections. Consequently, optical path lengths from the source to each segment should be very closely matched. An aperture corresponding directly to the desired profile could be placed in a widened parallel beam, but that would result in a relatively large light loss. To circumvent the loss of light, various alternative solutions are provided in the prior application US 2015109624, mentioned above.

The illumination emerging from the illumination source 442 may be monochromatic but is typically broadband in nature, for example white light, or polychromatic. A diversity of wavelengths in the beam increases the robustness of the measurement, as is known. The known sensor uses for example a set of four wavelengths named green, red, near infrared and far infrared. In a sensor implementing the present invention, the same four wavelengths could be used, or a different four, or more or fewer than four wavelengths might be used.

Referring to FIG. 4 again, aspects of the apparatus concerned with measurement using multiple wavelengths of radiation, and concerned with the management of polarization effects, will now be explained. In the illumination subsystem 440, the source 420 comprises four individual light sources that are provided to produce radiation of four wavelengths named green (labelled G), red (R), near infrared (N) and far infrared (F). For convenience in the following discussion, the radiation at these four different wavelengths will be called four colours of light, it being immaterial for present purposes whether they are in the visible or non-visible parts of the electromagnetic spectrum. The light sources are linearly polarized, with the G and N radiation being oriented the same as one another, and the R and F radiation being polarized orthogonally to the G and N polarization.

The four colours are transported by polarization maintaining fibres to a multiplexer 502 MUX, where they are combined into a single four-colour beam. The multiplexer maintains linear polarization, as indicated by arrows 504. The arrows 504 and similar arrows throughout the diagram are labelled G and R to indicate polarization of the green and red components. The N and F components are oriented the same as the G and R components, respectively.

This combined beam goes via suitable delivery optics 506 into beam splitter 454. As already described, it then reflects from a partially- or fully reflecting surface (e.g. a 0.5 mm diameter spot mirror), which is inside the beam splitter. The objective lens 424 focuses the beam to a narrow beam which is reflected and diffracted by the grating formed by the mark 202 on the wafer W. Light is collected by the objective, with for example numerical aperture NA=0.6. This NA value allows at least ten orders of diffraction to be collected from a grating with 16 µm pitch, for each of the colours.

The reflected and diffracted light forming information carrying beam 426 is then transported to the self-referencing interferometer 428. In this example, as already described, the beam is split 462 to supply a portion 464 of the information carrying beam to the asymmetry measuring arrangement 460, when provided. Signals 466 conveying asymmetry measurement information are passed from arrangement 460 to the processing unit PU. Just before the interferometer, polarization is rotated by 45° by a half wave plate 510. From this point on, polarization arrows are shown for only one colour, for clarity. The interferometer, as already described above and in the patent U.S. Pat. No. 6,961,116, consists of a polarizing beam splitter, where half of each colour is transmitted, and half of each colour reflected. Each half is then reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514 (having its major axis set at 22.5° to the X or Y axis). The half wave plates 510, 514 are wavelength insensitive, so that polarizations of all four wavelengths are rotated by 45°.

A further beam splitter 516 splits the optical signal into two paths designated A and B. One path contains the sum of the two rotated fields, and the other contains the difference. Depending on the initial polarization direction, the sum ends up in Path A or Path B. So in this example the sum signals for Green and NIR signals end up in one path, Red and FIR in the other. For each colour, the corresponding difference signal ends up in the other path.

Note that this arrangement chooses to use one polarization for illumination in each colour. Measurements with two polarizations per colour could be made, by changing the polarization between readings (or by time division multiplexing within a reading). However, to maintain high throughput while benefiting from some diversity in colour and polarization, a set of different colours with single, but different, polarizations represents a good compromise between diversity and measurement throughput. To increase diversity without impacting throughput, one can envisage an implementation similar to the four-colour scheme presented here, but using more colours, for example eight or sixteen, with mixed polarizations.

The light for each path A and B is collected by a respective collector lens assembly 484A and 484B. It then travels through an aperture 518A or 518B that eliminates most of the light from outside the spot on the substrate. Two multimode fibres 520A and 520B transport the collected light of each path to a respective demultiplexer 522A and 522B. The demultiplexer splits each path in the original four colours, so that a total of eight optical signals are delivered to detectors 430A and 430B within detector arrangement 430. In one practical embodiment, fibres go from the demultiplexer to eight detector elements on a detector circuit board. The detectors in this example provide no spatial resolution, but deliver time-varying intensity signals IA and IB for each colour, as the apparatus scans the mark 202 etc. on substrate W. The signals are actually position-dependent signals, but received as time-varying signals (waveforms) synchronized with the physical scanning movement between the apparatus and the mark (recall FIG. 3).

Processing unit PU receives the intensity waveforms from the eight detectors and processes them as in the known apparatus to provide a position measurement POS. Because there are eight signals to choose from, based on different wavelengths and incident polarizations, the apparatus can obtain useable measurements in a wide variety of situations. In this regard it should be remembered that the mark 202 may be buried under a number of layers of different materials and structures. Some wavelengths will penetrate different materials and structures better than others. PU conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations. In more advanced systems an automatic selection can be made, using "Color Dynamic" or "Smooth Color Dynamic" algorithms to identify the best signals without prior knowledge. This is described by Jeroen Huijbregtse et al in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003).

Each lens 484A, 484B focuses the entire field onto each element of each detector 430A, 430B, which is an arrangement similar to the known alignment sensor of FIG. 3. The detectors in this example and in the known alignment sensor are effectively single photodiodes and do not provide any spatial information except by the scanning motion described already. A detector having spatial resolution in a conjugate pupil plane can be added, if desired. This may, for example, allow angle-resolved scatterometry methods to be performed using the alignment sensor hardware.

The mark may need to be scanned more than once if it is desired for example to measure position using two different polarizations. Also it may be required to switch the illumination mode midway through scanning the XY mark. In other embodiments, however, we use multiplexing of optical signals so that two measurements can be made simultaneously. Similarly, multiplexing can be applied so that different portions of the XY mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at each detector 430A, 430B will be a mixture of two signals, but they can be separated electronically using filters tuned to the respective frequencies of the source radiation. Time division multiplexing could also be used, but this would require accurate synchronization between source and detector. The modulation at each frequency can be a simple sine or square wave, for example.

If it is desired to illuminate a mark with circular polarization, whether for position sensing or some other form of metrology, a quarter wave plate (not shown) can be inserted between beam splitter 454 and objective 424. This has the effect of turning a linear polarization into a circular one (and changing it back again after diffraction by the mark). The spot positions are chosen as before according to the mark direction. The direction of circular polarization (clockwise/counter clockwise) can be changed by selecting a different linear polarization in the illumination source 420, fibre 422 or illumination profiling optics 446.

Also described in the paper by Huijbregtse et al is the use of multiple gratings in a composite target. Each grating has a different profile, enhancing for example higher diffraction orders (3rd, 5th, 7th). Position measurements can be derived from different ones of these gratings, as well as from different colour signals on an individual grating. In some embodiments of the present disclosure, it is assumed that there is a single grating with a simple bar pattern, but having segmented features. The skilled reader can readily expand the disclosure to envisage embodiments having multiple gratings with different patterns.

Figure 5:
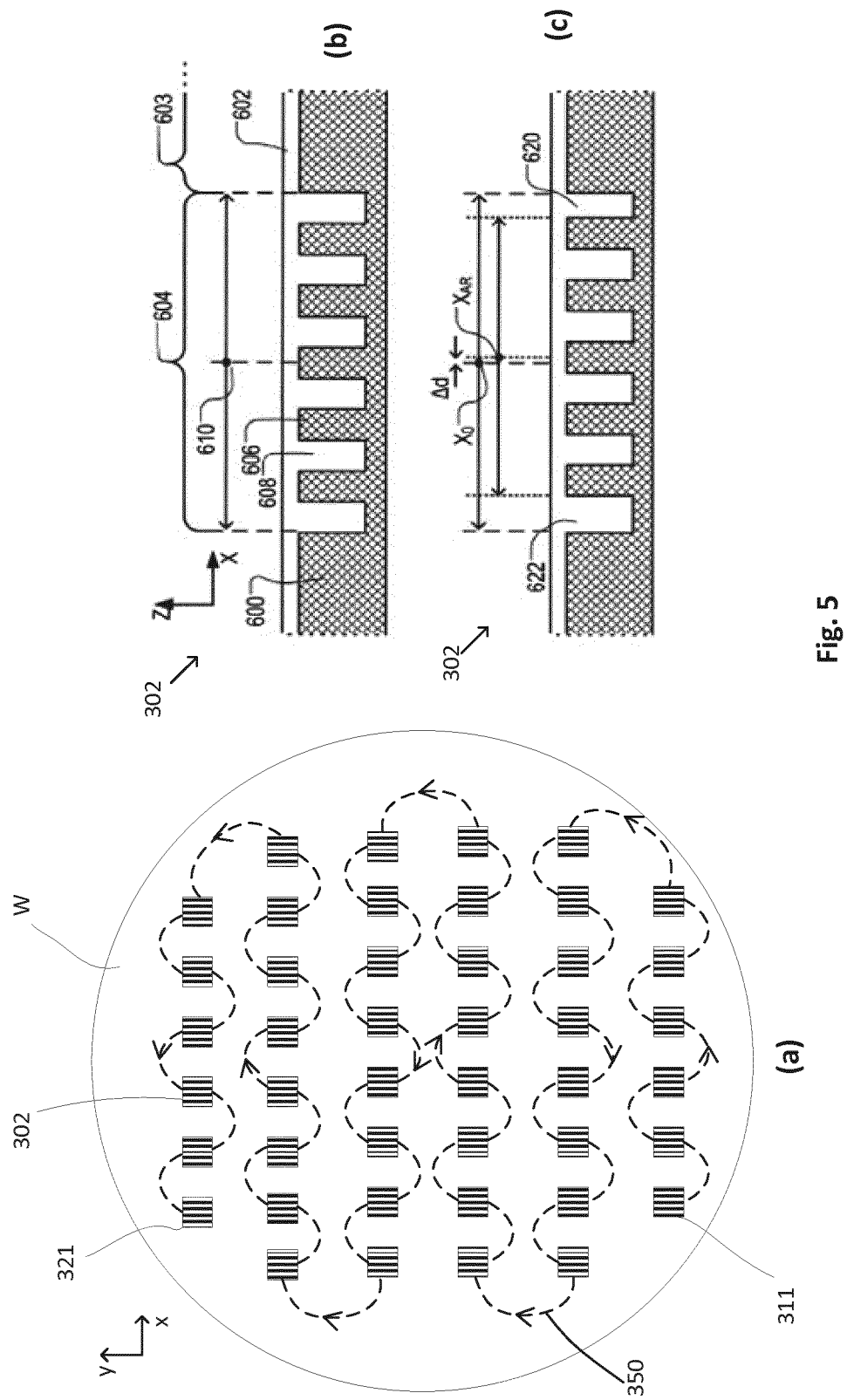
FIG. 5, comprising FIG. 5(a), FIG. 5(b) and FIG. 5(c), schematically depicts the effects of projection errors on the formation of marks on a substrate.

Projection errors are alignment position errors that arise during the projection of marks onto a substrate (e.g. due to optical aberrations in the projection system PS). With reference to FIG. 5, the effects of projection errors on the formation of marks on a substrate W will now be explained. FIG. 5(a) schematically depicts a substrate W with a plurality of marks 302 formed on its surface. For example, one mark may be formed at each target portion C of the substrate W. There may be a larger or smaller number of marks formed on the substrate W. For example, twenty marks may be formed on the substrate W. In general the marks may be distributed across the substrate W. One mark may, for example, comprise one grating oriented in the X-direction and one grating oriented in the Y-direction. The marks may take other forms. The size of the marks 302 is exaggerated for ease of illustration. The marks 302 comprise structures arranged periodically in at least a first direction. FIG. 5(b) shows in cross-section a small portion of an example of the mark 302 (which may correspond with the X-direction mark 202 in FIG. 2(a)). FIG. 5(b) schematically depicts one repeating unit comprising a material-space pattern that is repeated with a known periodicity in at least a first direction to form the whole mark. The mark is formed in materials 600, 602 having different refractive indices, arranged in a periodic pattern whose repeating unit comprises "material" regions 603 and "space" regions 604. The repeating unit of a "material" region 603 and a "space" region 604 may be referred to as a structure. The structures are arranged periodically in at least a first direction. The material-space pattern may in particular be formed by etching a pattern that is projected onto the substrate W using the projection system PS of the lithographic apparatus of FIG. 1 (or a similar apparatus). Each "space" region 604 of the mark may be formed such that the material 600 is not uniformly absent, but is present in a fine-pitch grating pattern comprising finer material regions 606 and finer space regions 608. These finer material regions 606 and finer space regions 608 are what is referred to herein as the "at-resolution" features, being at or close to the limit of resolution of the projection system in the lithographic apparatus that will use them. The finer material regions 606 may also be referred to as "sub-resolution" features because the alignment sensor AS shown in FIGS. 1 and 4 may not have the resolution necessary to resolve these features. A finer material region 606 followed by a finer space region 608 may be referred to as a sub-structure. The sub-structures are also periodic, and have a smaller period than the structures.

The marks 302 may be referred to as sub-segmented marks due to the presence of their structures and sub-structures. The sub-structures of the sub-segmented marks have a similar period as the product features. Sub-segmented marks therefore provide the advantage of behaving similarly to product features when exposed to radiation. Subsequently exposed dies that include product features having a similar resolution and/or density on the substrate as the sub-segmented marks present on the substrate may be better aligned to their intended positions as a result of using the sub-segmented marks to align the product features on the substrate.

The marks 302 are formed on the substrate W via a lithographic process that involves exposing the substrate to actinic radiation carrying a desired mark pattern. The desired mark pattern may be imparted to the radiation by a patterned mask that acts to diffract radiation passing through it. The patterned mask comprises periodic features that impart radiation with a desired pattern for the formation of the structures. These mask features may be referred to as mask structure features. The patterned mask also comprises periodic features that impart radiation with a desired pattern for the formation of the sub-structures. These mask features may be referred to as mask sub-structure features. The mask structure features have a larger period than the mask sub-structure features. Radiation diffracted by the patterned mask is focussed by a projection system in order to form the structures and sub-structures on the substrate W.

FIG. 5(a) shows an example radiation exposure path 350 that may be used to form the marks 302 on the substrate W. The radiation exposure path 350 begins with the formation of a first mark 311 and meanders across the substrate W forming other marks until forming a final mark 321. The projection system comprises one or more optical elements such as, for example, lenses. The lenses will absorb some heat energy from radiation passing through the lenses. Heat energy absorbed by the lenses may result in optical aberrations. The optical aberrations may change over the duration of the radiation exposure path 350 due to the cumulative amount of heat energy absorbed by the lens during the radiation exposure path. Therefore, radiation forming a first mark 311 in a radiation exposure path 350 may experience significantly different optical aberrations compared to radiation forming a final mark 321. The optical aberrations may vary significantly between consecutively formed marks 302 along a radiation exposure path 350 on the substrate W.

Because the mask structure features and the mask sub-structure features have different periods, radiation diffracting from the mask structure features will travel through different parts of the projection system compared to radiation diffracting from the mask sub-structure features. Optical aberrations caused by the projection system vary depending on the part of the projection system that the radiation travels through. Therefore radiation diffracting from mask structure features will experience different optical aberrations compared to radiation diffracting from mask sub-structure features. This difference in optical aberrations experienced by radiation diffracting from mask features having different periods results in the structures having projection errors that are different to projection errors of the sub-structures. This effect is illustrated by FIG. 5(b) and FIG. 5(c). Referring to FIG. 5(b), it may be desired that the periodic sub-structures formed by finer material regions 606 and finer space regions 608 are aligned with a centre point 610 of the space region 604 of the structure. This centre point 610, averaged over all of the structures of the mark, may define a central reference position of the whole mark. As discussed above, sub-segmented marks are sensitive to projection errors such as, for example, optical aberrations in the process by which the sub-segmented mark is formed. These projection errors may cause a shift or positional offset between the sub-structures and the structures.

FIG. 5(c) shows the form of such a shifted mark, similar to the desired mark depicted in FIG. 5(b), but exhibiting a positional offset or mismatch between the structure and the sub-structures. The mark has become asymmetric due to the positional offset between the structure and the sub-structures. A finer space region 620 at one end of a space region 604 of the structure has become slightly narrower than a finer space region 622 at the other end of the space region 604 of the structure. The sub-structures have a centre point at a position XAR which is not exactly coincident with the centre point X0 of the space region 604 of the structure. A positional offset $\Delta d$ represents the difference between X0 and XAR, and may be in the order of, for example, nanometers. The positional offset $\Delta d$ is caused by unknown components relating to projection errors resulting from, for example, optical aberrations of the projection system or focus errors of the lithographic apparatus.

Projection errors resulting from, for example, optical aberrations may cause a positional offset between a centre of the sub-structures and a centre point of the space region 604 of the structure. As an illustrative example, with reference to FIG. 5(a), the structures of the first mark 311 may correspond with the structures of the desired (and designed) mark depicted in FIG. 5(b). The structures of the final mark 321 may correspond with the shifted mark depicted in FIG. 5(c). This difference between the first mark 311 and the final mark 321 may be caused by varying projection errors, e.g. varying optical aberrations as the projection system absorbs heat energy throughout the duration of the radiation exposure path 350. The varying optical aberrations may gradually increase the positional offset of consecutively formed marks 302 along the radiation exposure path 350. This may create gradually changing positional offsets in the marks. The gradual change of the positional offsets of the marks may follow the radiation exposure path used to form the marks. The varying positional offsets of the marks 302 caused by optical aberrations may therefore be associated with the radiation exposure path 350 used to form the marks.

Other sources of projection errors may also contribute to a positional offset between structures and sub-structures. The substrate may not be positioned at a desired focus with respect to the projection system, which may lead to the presence of focus errors during the formation of the marks. Focus errors present during the formation of the marks on the substrate may contribute to a positional offset between the structures and the sub-structures. For example, if an illumination mode such as a quadrupole illumination mode is used to illuminate the substrate during formation of marks, an imbalance between the poles of the illumination mode (e.g. varying brightness between poles) combined with the presence of focus errors may result in a positional offset between the structures and sub-structures of a mark. As another example, different projection errors may arise when radiation passes through different positions within an exposure aperture of the projection system.

Figure 6:
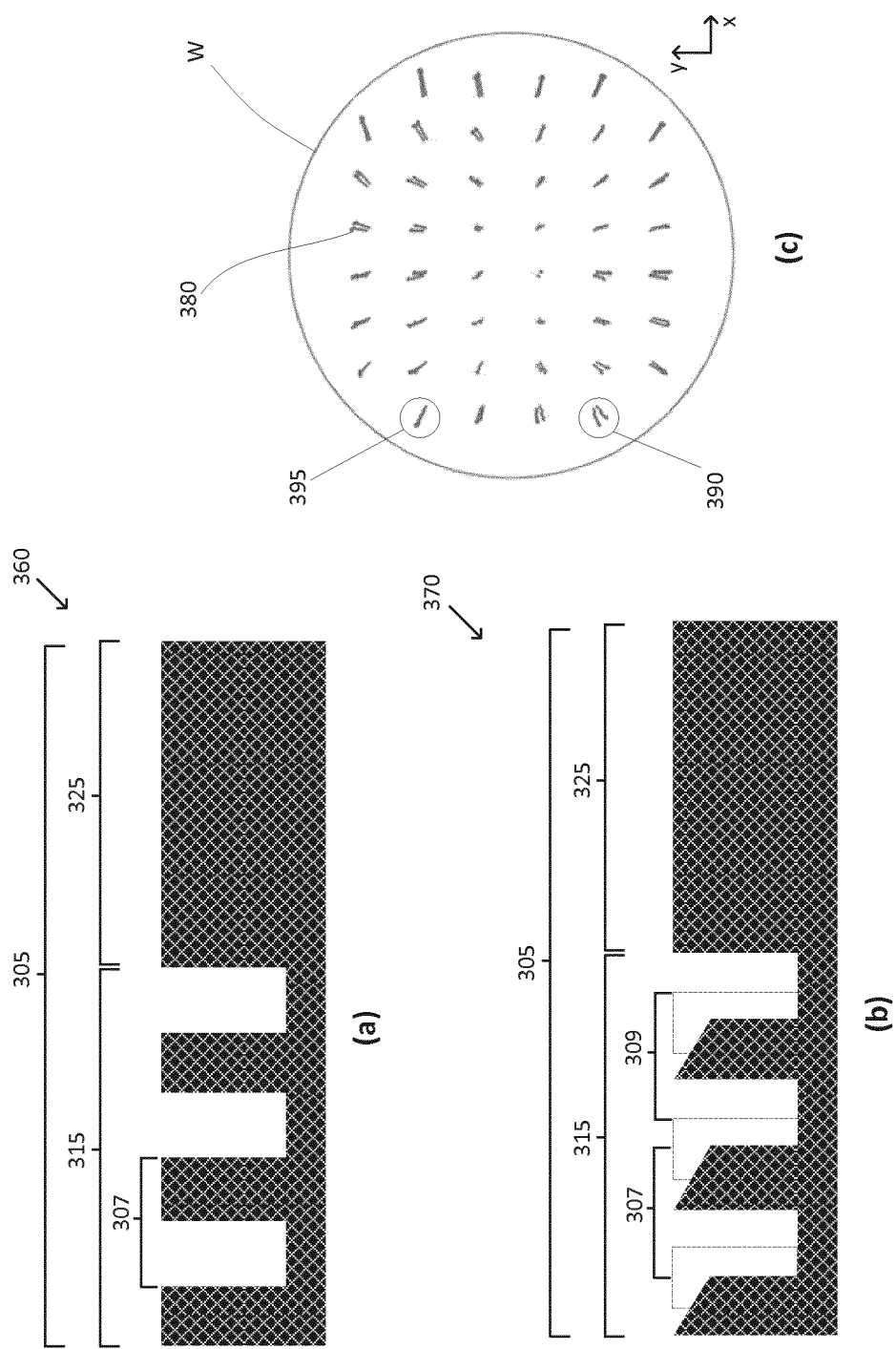
FIG. 6, comprising FIG. 6(a), FIG. 6(b) and FIG. 6(c), schematically depicts the effects of substrate processing errors on marks formed on a substrate.

FIG. 6 schematically illustrates the effects of substrate processing errors on the measured position of marks on a substrate W. FIG. 6(a) schematically depicts a designed (error-free) or intended structure 360 that forms part of a mark before substrate processing has taken place. Substrate processing may involve, for example, etching, chemical mechanical polishing (CMP) and/or other techniques that are known to a person skilled in the art. Such fabrication techniques are imperfect and therefore result in some unwanted (and unknown) alterations of the marks, which in turn result in errors in the measurement of the position of a mark. FIG. 6(b) schematically depicts a processed structure 370. In the example of FIG. 6(b), a fabrication technique, such as CMP or etching, has altered the shape of the sub-structures 307. Substrate processing errors may introduce asymmetries in the marks by changing the shape of the structures and/or sub-structures that form the marks. When the processed structure 370 is exposed to radiation during position measurement, the alignment system will detect a mark that has an apparent shifted position 309 of sub-structures 307 due to the altered shape of the sub-structures. This will result in the alignment sensor measuring an incorrect position of the mark comprising the processed structure 370. In other words, due to the asymmetries introduced to the mark by substrate processing errors, the measured position of the processed mark is not the actual position of the processed mark.

FIG. 6(c) is a vector diagram showing the effect of etching on the measured position of the marks on the substrate W. Each vector 380 represents a mark. In the example of FIG. 6(c), the positions of marks on the substrate W form a grid-like pattern, wherein points of the grid-like pattern comprise two closely spaced marks (represented by two closely spaced vectors). The length of each vector 380 represents a variation in the measured position of the marks when measured with radiation having different characteristics, e.g. two different wavelengths. That is, the start of a vector 380 is the position of a mark when measured with radiation having a first wavelength, and the end of the vector is the position of the same mark when measured with radiation having a second wavelength. The vectors 380 are indicative of the amount of asymmetry that has been introduced to each mark by etching the substrate W. The variation in the measured position of the marks is smaller at the centre of the substrate W relative to the variation at the edge of the substrate. That is, the variation increases in magnitude as a function of radial distance from the centre of the substrate W. The vectors 380 that represent the variations in measured mark positions tend to extend outwardly from the centre of the substrate W in a substantially radial direction. The variation may be substantially the same for a pair of closely spaced marks 395 or the variation may be significantly different for a second pair of closely spaced marks 390. In general the variation depends on the substrate and the processes which have been applied to that substrate.

Other substrate processing errors may give rise to different variations having different characteristics compared to those depicted and described in relation to etching. For example, for a wafer W with the grid-like arrangement of marks shown in FIG. 6(c), variations associated with the effects of CMP may give rise to a spiral-like pattern of vectors across the substrate. That is, the variation may still increase in magnitude as a function of radial distance from the centre of the substrate W, but with the vectors extending in a substantially tangential direction rather than a substantially radial direction. The effects of unknown components relating to substrate processing errors that arise from different processes may give rise to different discernible variations and positional offsets of the measured mark positions as a function of spatial position on the substrate W.

The variations in the measured positions of the marks that are associated with substrate processing errors may have a lower spatial frequency than variations caused by projection errors. That is, the variation of the measured positions of the marks, using two different wavelengths of radiation, as a function of spatial positions of the marks on the substrate W may not change significantly between a mark and the next nearest mark in a given direction along the substrate W. On the other hand, variations of the measured positions of the marks that result from projection errors may be expected to have a higher spatial frequency than variations that result from substrate processing errors. A difference between the form or type of the variations caused by substrate processing errors compared with the form or type of variations caused by projection errors may also be used to select a constituent part of the signals. For example, the magnitude of variations may increase in a substantially radial direction, which may indicate that those variations are due to etching or CMP. Alternatively, the magnitude of variations may increase along the substrate in a path that follows a radiation exposure path used to form the marks on the substrate, which may indicate that those variations are due to optical aberrations. In general there are a plurality of discernible differences between variations caused by projection errors and variations associated with substrate processing errors.

Figure 7:
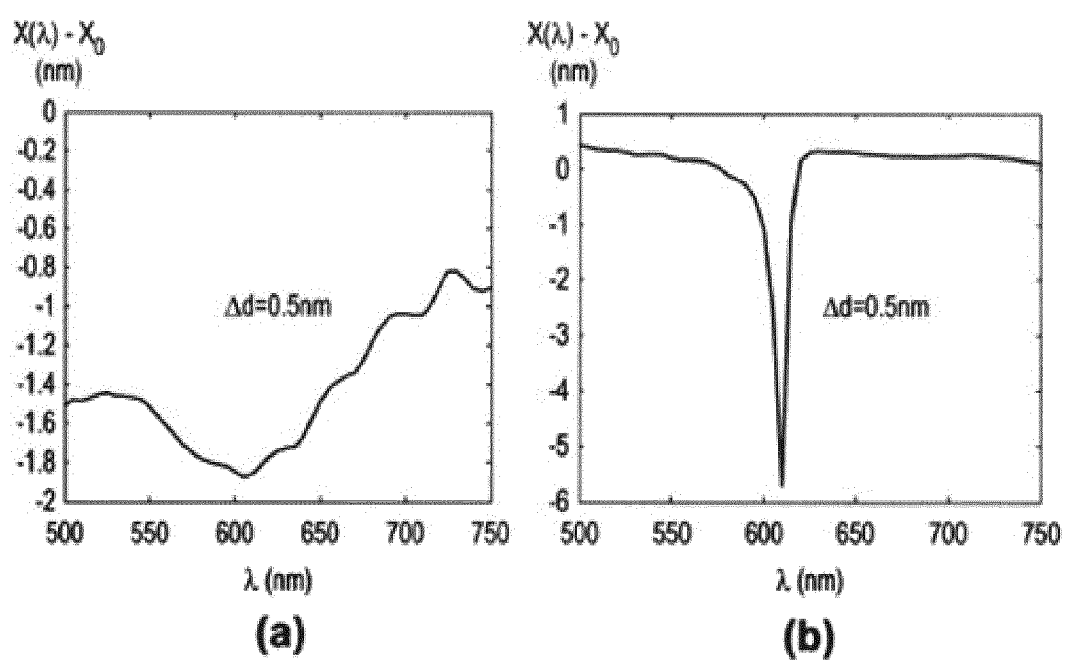
FIG. 7 shows response curves modelling the influence of a certain positional offset on measured position, for a range of radiation wavelengths and polarizations.

Referring now to FIG. 7, the graphs (a) and (b) illustrate that the asymmetric nature of the sub-segmented mark may result in that an alignment system measures a mark position which depends on the colour (wavelength) used. While the design of other types of alignment systems may be different, in general the measured position of the mark will be different for different wavelengths and illumination conditions. The graphs of FIG. 7 show a measured position from a simulated sensor for a pattern with a known positional offset $\Delta d = 0.5$ nm. The vertical axis represents the position error X relative to the centre of the structure X0 (this position is known because a simulation is illustrated, not a real measurement of an unknown target), and the horizontal axis represents the wavelength of the measurement beam. For this example the simulation assumes a mark having a structure period of 3 µm, a sub-structure period of 200 nm and a depth of finer space regions of 256 nm. The material 600 is silicon and the other material 602 is air. In graph (a) the illumination has Y-polarization (parallel to the grating lines for an X-direction mark), while graph (b) shows the result with X-polarization. Not evident from the graphs is that X-polarization has a higher diffraction efficiency than Y-polarization, for a mark 202 that is periodic in the X direction.

What can be seen in each graph of FIG. 7 is that the position reported by the simulated measurement varies quite widely in a manner strongly dependent on the wavelength and the polarization of the radiation. The range of variation is moreover much greater than the magnitude of the positional offset $\Delta d$ that caused it. In the graph (b) a very strong resonance effect is observed which results in extreme measurement errors around a wavelength of 610 nm.

Figure 8:
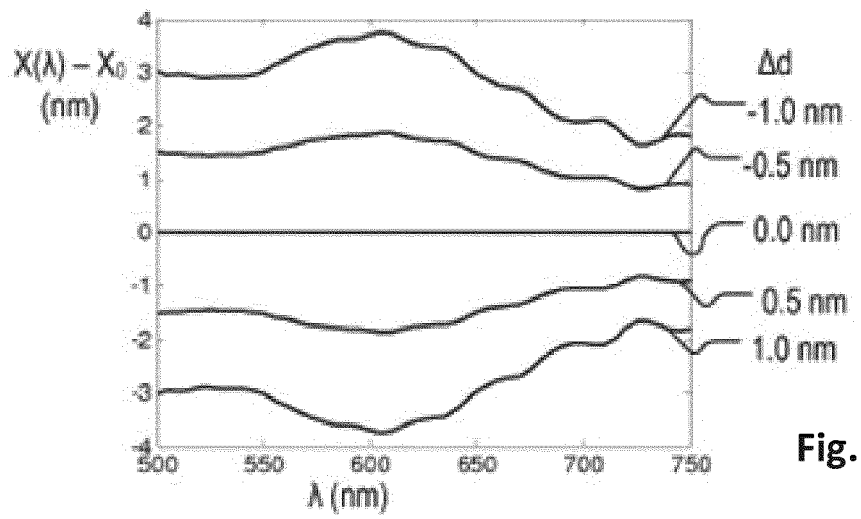
FIG. 8 shows response curves calculated for a range of positional offset values.

FIG. 8 is a simulated graph corresponding to FIG. 7(a), in which the alignment position error X-X0 is plotted as a function of wavelength for five different positional offset values $\Delta d$ ranging from −1 nm to +1 nm. It is observed that the colour dependent alignment position is, to a good approximation, a linear function of the positional offset between the sub-structures and the structures. That is, a linear relationship exists between position information contained in the detector output signals from the alignment system and the positional offsets of the marks measured by the alignment system. The observation of linearity both in the alignment position offset as well as in position measurements performed using different wavelengths may be used to obtain position measurements corrected for the positional offset present in the sub-segmented marks.

Figure 9:
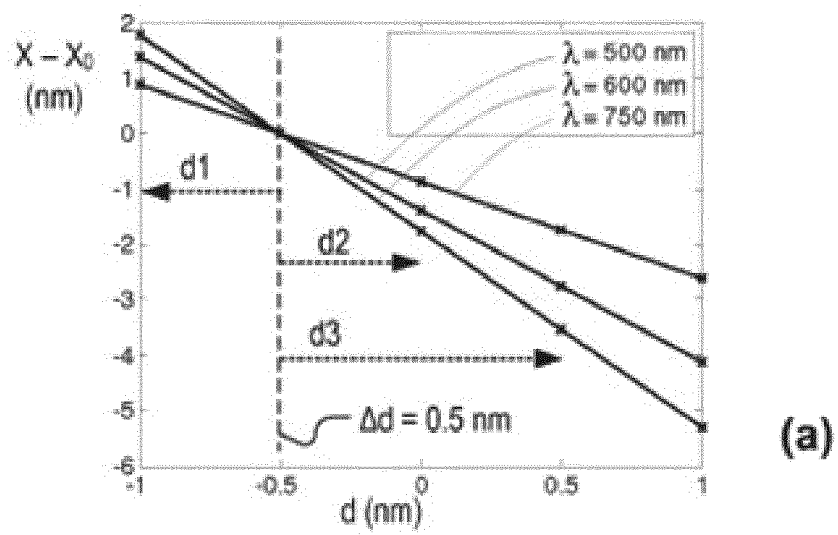
FIG. 9 illustrates the influence of different positional offset values on a position error measured at different wavelengths.
Figure 9:
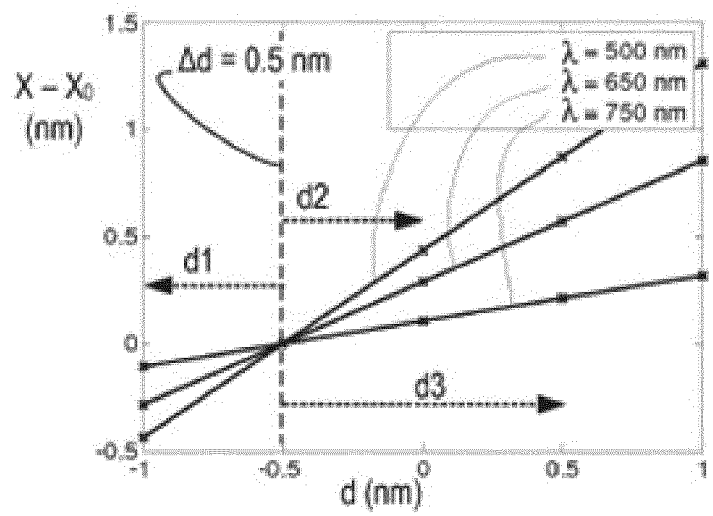

FIG. 9 further illustrates the linearity of the alignment position error with different positional offsets for measurements made using radiation having (a) Y polarization and (b) X polarization each at three different wavelengths λ. The horizontal, or X-, axis in this case represents the value of a known component of positional offset d that has been deliberately introduced, or designed, into a simulated mark structure. The vertical, or Y-, axis represents the position error X relative to the centre of the structure X0. The known component of positional offset d is added to a simulated positional offset Δd of 0.5 nm with different values indicated as d1, d2, d3 etc. Note that for each wavelength and polarization the measured position of the mark varies linearly with the known component of the designed positional offset d. Note moreover that the measured position of the mark matches exactly the centre position of the structure (X−X0=0) when the added (designed) positional offset d is equal to −0.5 nm and cancels the modelled positional offset of Δd which is equal to +0.5 nm. Under this condition the mark may be considered to be symmetric, and the error of the measured position of the mark is zero regardless of wavelength or polarization. Furthermore, in the case that the known component of the positional offset d is zero, graphs (a) and (b) of FIG. 9 show that the (simulated) value of the position error X relative to the centre of the structure X0 depends on the wavelength and the polarization.

Figure 10:
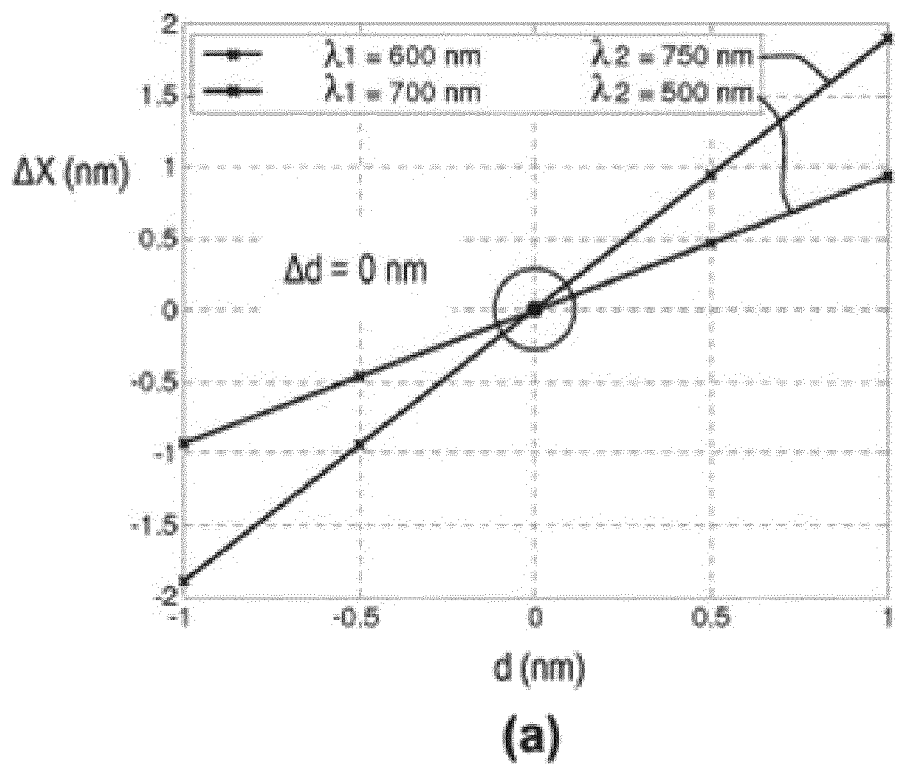
FIG. 10 illustrates the influence of different positional offset values (deliberate positional offset) on differential position measurements made between different pairs of wavelengths in a mark having (a) zero positional offset and (b) non-zero positional offset.
Figure 10:
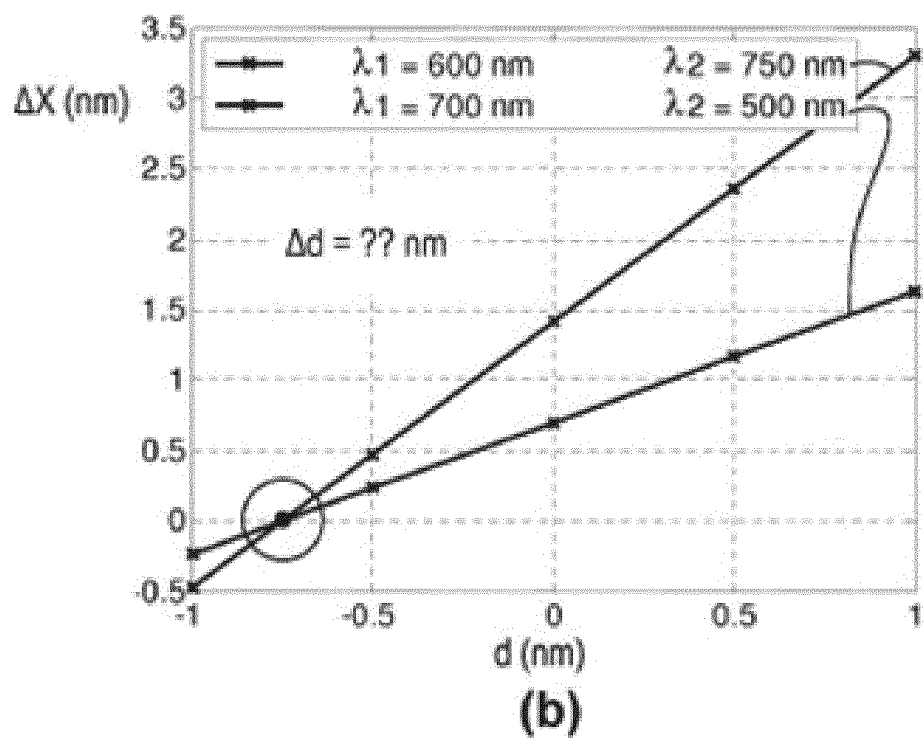

In the simulated measurements shown in FIG. 9, the positional offset is known, but that is not the case in a real measurement situation. FIG. 10 illustrates how the known relationship (linearity) between the positional offset and the alignment position error can be exploited to combine position measurements at different wavelengths and/or polarizations to determine all of X0, XAR and Δd, if desired.

In FIGS. 10(a) and 10(b) the vertical or Y-axis represents the difference ΔX between a position X1 of a mark measured using wavelength λ1 and a position X2 of a mark measured using a wavelength λ2 for different values of λ1 and λ2, and the horizontal or X-axis represents the known (designed) positional offset d. In FIG. 10(a) the measurements are simulated with a positional offset of Δd=0 nm as a function of different values of the known component of the positional offset d. Whatever wavelengths are selected, because of their linear relationship, as illustrated in FIG. 9, the difference value ΔX will be zero when the known component of positional offset d is zero. In the simulation of which the results are shown in FIG. 10(b), a positional mismatch Δd of 0.75 nm has been used. However, in reality the value of Δd is unknown. From FIG. 10(b) it is observed that the difference between reported positions of a mark ΔX is zero when the known component of the positional offset d is −0.75 nm. That is, when the known component of positional offset d exactly cancels the (unknown) positional offset Δd the difference between reported positions of a mark ΔX is zero. Thus, by producing a mark that is designed to have structures and sub-structures with different known components of offsets between them, two points on a linear graph can be obtained to calculate the position at which the position error is zero and to determine positional offset Δd by interpolation or extrapolation.

Figure 11:
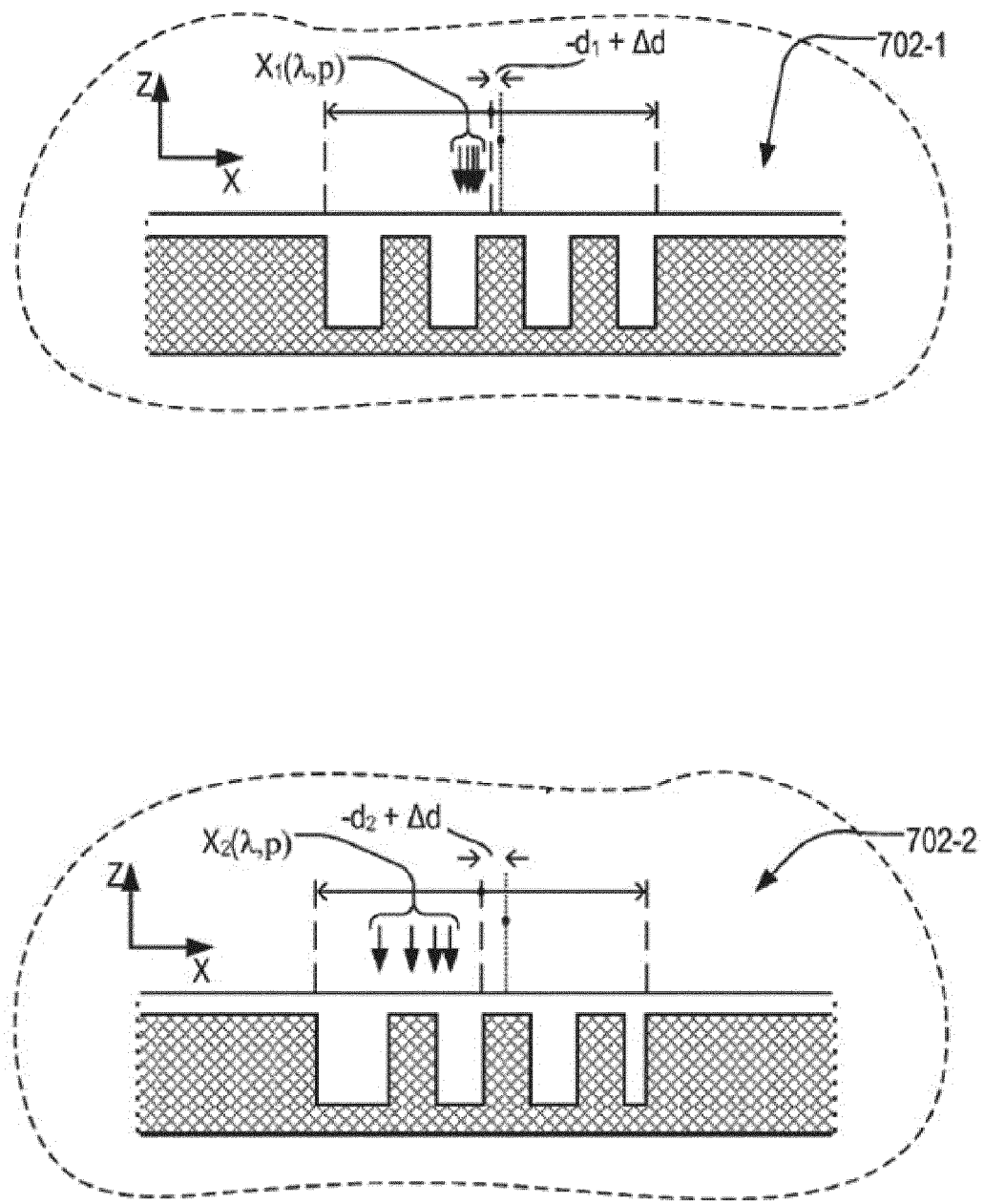
FIG. 11 schematically depicts an in plane view and cross-sectional views of a two-part differential mark in accordance with an embodiment of the present invention.

FIG. 11 illustrates the structure of two marks 702-1, 702-2 for use in exploiting the principle as presented above. The marks 702-1, 702-2 may be used in place of the simple mark 202. Versions of marks with Y direction and XY direction can be readily envisaged as well. Each mark 702-1, 702-2 comprises periodic structures and sub-structures of the general form illustrated in FIGS. 5 and 6. Optionally, coarser structures may also be provided nearby by which the marks may be detected by the alignment system in a preliminary step. Such details are well known to the skilled reader. A schematic cross-section of a portion of a first mark 702-1 is shown at the top of FIG. 11, while a schematic cross-section of a portion of a second mark 702-2 is shown at the bottom of FIG. 11. In these cross-sections, just as in FIG. 5(b) and FIG. 5(c), only a portion of one of the structures is shown, centred on a space region of the structure. Several sub-structures are shown, and positional offsets are exaggerated for clarity. The period of the sub-structures may, for example, be within the range 70 nm to 200 nm. The period of the structures may, for example, be within the range 1600 nm to 8000 nm. A mark may therefore have in the region approximately four to fifty-three sub-structures in each space region of the structures. A larger or smaller number of sub-structures may be used. In each mark 702-1, 702-2 there is both an unknown component of positional offset Δd caused by optical aberrations and/or substrate processing errors during formation of the mark, and a known (designed) component of positional offset d. The unknown component of positional offset is equal (or assumed equal) for the two marks 702-1, 702-2, while the marks are designed so that the first mark has a known component of positional offset d1 which is different from the known component of positional offset d2 applied in the second mark 702-2. In practice, one may prefer to choose the known components of positional offsets d1, d2 to have positive and negative values of equal magnitudes so as to balance the known component of positional offset d at either side of zero (that is, d1=−d2). However, the method to be described works with unequal magnitudes and with known components of positional offsets that are both in the same direction. Similarly, the known component of positional offset does not need to be either larger or smaller than the unknown component of positional offset. The example illustrated in FIG. 11 has positional offsets in opposite directions, but with magnitudes less than the unknown component of positional offset Δd. Therefore the total positional offset is in the same direction for both the first 702-1 and the second 702-2 marks.

The combined shift −d2+Δd in the second mark 702-2 is shown as being greater in magnitude than the combined shift −d1+Δd in the first mark 702-1. The measurements of the mark position X that are reported by the alignment system for different colours and polarizations in the second mark 702-2 are much more widely spaced, and much further from the true position of either the structures or sub-structures, than the positions reported for the first mark 702-1. In terms of the calculation, the position difference ΔX calculated for the second mark 702-2 will be much greater than the position difference ΔX calculated for the first mark 702-1. As already shown in the graphs of FIGS. 9 and 10, if one of the known components of positional offsets would exactly cancel the positional offset, all of the reported positions would be the same and ΔX for that mark would be zero.

The method of determining the position of marks described above assumes that all asymmetries measured by the alignment sensor AS are due to projection errors, e.g. optical aberrations and/or focus errors combined with imbalanced poles of an illumination mode. Asymmetries that are due to substrate processing errors, e.g. etching effects or CMP effects on the structures and sub-structures, are incorrectly attributed to projection errors by the alignment sensor AS. That is, the linear relationship between positional offset of structures and sub-structures, and the position error that is used to obtain position measurements corrected for the positional offset present in the sub-segmented marks is no longer applicable if substrate processing errors are misallocated as being projection errors. This misallocation of measured asymmetries manifests as an error when the position of the mark is calculated. It is desirable to provide a method of discriminating, or distinguishing between, the asymmetries caused by projection errors and the asymmetries caused by substrate processing errors in order to improve the accuracy of the alignment method.

Projection errors, such as those caused by changing optical aberrations throughout the duration of an exposure path across the substrate W, may cause significantly different shifts to consecutively formed marks on the substrate W, whereas variations that are due to substrate processing effects may change by a smaller amount between consecutively formed marks on the substrate. Because the projection errors, such as optical aberrations, are expected to have a greater variation between different marks on the substrate compared to substrate processing errors, a variation in the measured position of marks on the substrate, using e.g. two different wavelengths of radiation, is expected to have a higher spatial frequency than variations that are due to substrate processing errors that arise from, for example, etching and/or CMP.

Figure 12:
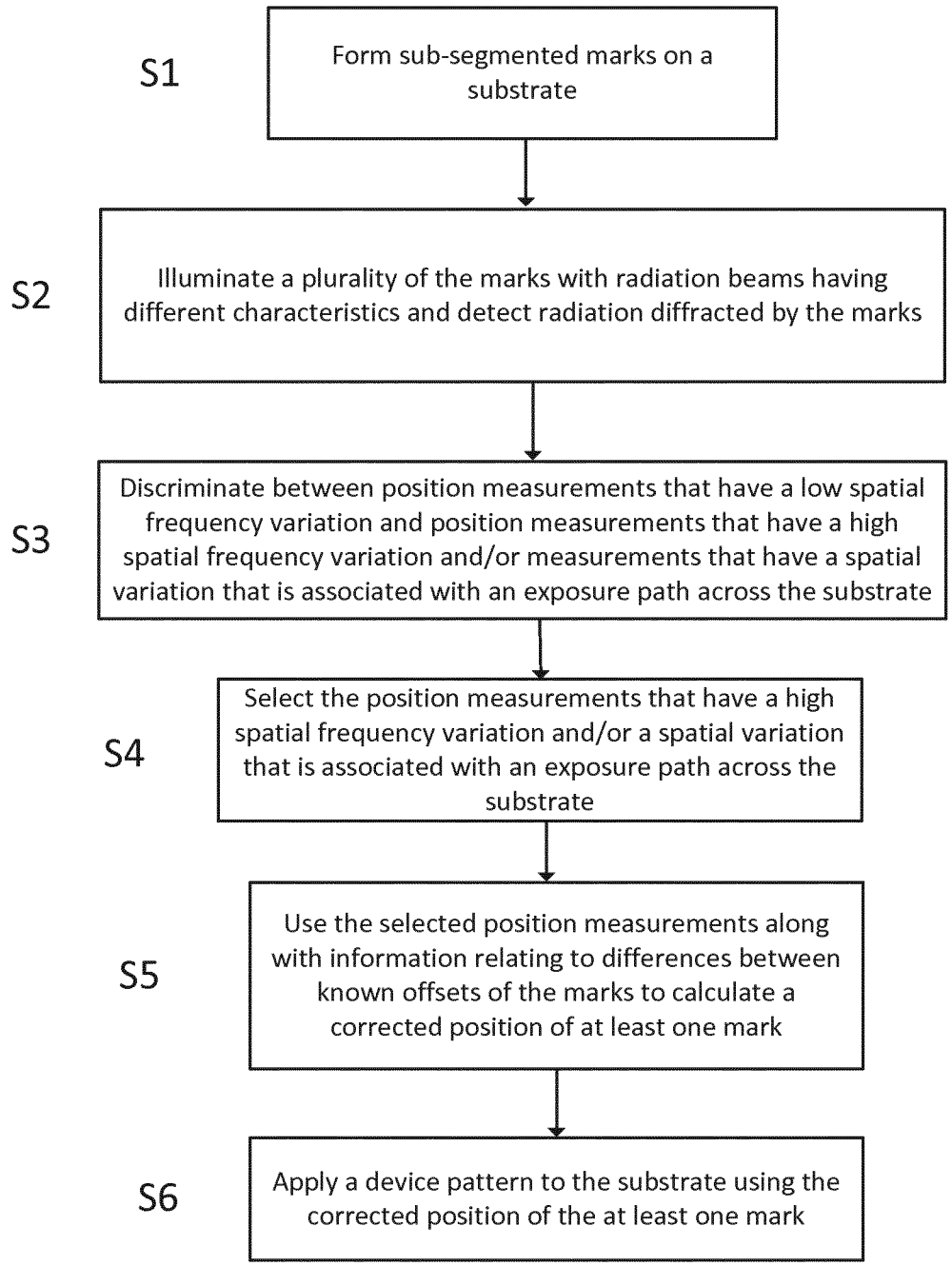
FIG. 12 is a flowchart of a method of measuring position using the differential mark of FIG. 11.

Referring to the flowchart of FIG. 12, we now describe one embodiment of a method to obtain more detailed position measurements using the marks with known (designed) components of positional offsets d. It is assumed that the measurements are performed as part of an alignment step in a lithographic apparatus of FIG. 1, but the method can be applied to make position measurements in other apparatus. A simple example will be presented using a plurality of marks of the type shown in FIG. 11 and two wavelength/polarization combinations to measure position in one direction. More complexity can be added in a real implementation, if desired, and some extensions of the method will be described briefly below. The steps of this method may be combined with the performance of other measurements using the same marks. Fewer steps can be applied, if desired, for example, because only one particular result is desired to be output. The overall method will be described first, followed by an explanation of the underlying mathematical calculations. The techniques disclosed herein are in no way limited to these particular examples, or to any particular form or mathematical expression. The concepts explained herein can be expressed in many different notations and algorithms, while still applying the basic principles disclosed here.

In step S1, a substrate has a plurality of sub-segmented marks formed on it to serve as position measurement marks in the lithographic process. Typically many marks are formed across the substrate. The marks comprise periodic structures and sub-structures formed by a lithographic process in which projection errors such as, for example, optical aberrations introduce an unknown positional offset $\Delta d$ between the positions of the structures and the sub-structures. Substrate processing errors arising from, for example, CMP or etching result in an apparent offset between the positions of the structures and the sub-structures as measured by the alignment system. For the reasons set out above, the marks are formed having different known components of positional offsets d in addition to the unknown component of positional offsets $\Delta d$.

The substrate is loaded into a lithographic apparatus for the purpose (in this example) of applying a device pattern.

In step S2, an alignment system AS of the lithographic apparatus is used to collect detector signals that contain information relating to the positions of the marks. The signals are created by illuminating the marks with radiation beams having different characteristics such as, for example, different combinations of wavelength and polarization ($\lambda$, p). The radiation beams used to illuminate the marks may have two different wavelengths within the range of, for example, 400 nm-900 nm. Other wavelengths may be used. Radiation diffracted by the marks is detected by one or more detectors. The detectors output the signals containing information relating to the position of the mark.

In step S3 constituent parts of the signals are discriminated. The discrimination of constituent parts of the signals is based on a variation of the signals as a function of spatial positions of the marks on the substrate. The signals comprise constituent parts that have different origins. The signals comprise at least one constituent part that is associated with projection errors caused by optical aberrations present during the formation of the marks. The signals comprise at least one constituent part that is associated with substrate processing errors arising from, for example, etching of the substrate. The number of marks used to discriminate between the constituent parts of the signals may depend upon the magnitude of the projection errors and/or the type of substrate processing errors that are present during the formation of the marks on the substrate. When the signals are processed, e.g. by a processor, the constituent parts of the signals are discriminated based on a variation of the signals as a function of spatial positions of the marks on the substrate. The rationale behind the discrimination of constituent parts is further discussed below.

In step S4 at least one of the constituent parts of the signals is selected. The constituent part of the signals that is associated with projection errors is expected to comprise a part of the signals which has a higher spatial frequency variation than the constituent part of the signals that is associated with substrate processing errors. A constituent part of the signals that is not selected may therefore comprise a part of the signals which has a lower spatial frequency variation than the selected constituent part of the signals. A lower spatial frequency variation may correspond with distances that are larger than a distance between adjacent target portions C of the substrate W. A high spatial frequency variation may correspond with distances that are equal to or smaller than the distance between adjacent target portions C of the substrate W. In general, spatial frequency variations may be assigned as being higher spatial frequency variations or lower spatial frequency variations by reference to the distance between adjacent target portions C on the substrate W. For example, the distance between adjacent target portions C on the substrate W may be approximately 20 mm, in which case a frequency that is lower than approximately 0.05 per mm may be considered as being a lower spatial frequency variation, and a frequency that is equal to or higher than 0.05 per mm may be considered as being a higher spatial frequency variation. Variations that are considered as being higher spatial frequency variations and variations that are considered as being lower spatial frequency variations may vary between different substrates, marks, projection systems, radiation exposure paths, etc.

The form of the variations may also be used to select a constituent part of the signals. As discussed earlier with reference to FIG. 6(c), the variations may increase in a substantially radial direction, which may indicate that those variations are due to etching. The form of variations may instead change along the substrate in a path that follows a radiation exposure path used to form the marks on the substrate, which may indicate that those variations are due to optical aberrations that change along the radiation exposure path due to heating of the projection system.

In step S5 the selected constituent part of the signals is used, along with information relating to differences between the known components of the positional offsets of the marks, to calculate a corrected position of at least one mark. The calculation is described in detail below.

In step S6, after calculating a corrected position of all the desired marks, a product or device pattern is applied at the target portions C of the substrate W (FIG. 1) using the projection system PS of the lithographic apparatus. Because the positional offset has been measured and mark positions have been corrected accordingly, positioning of the product features is more accurately aligned with a desired position on the substrate, and with underlying features made in previous lithographic steps. While the measured centre position of the periodic structures that form the mark X0 is already more accurate than in the conventional method, note that the position of at-resolution features XAR (i.e. the position of sub-structures) is also directly available, despite these features being far below the resolving power of the alignment system. This raises the possibility to use the at-resolution position XAR in the positioning of the applied pattern. Since the at-resolution features are more similar to the product features in the applied pattern, using this position measurement may give more accurate placement of those product features than the centre position of the periodic structures X0 (assuming that the aberrations in the lithographic step will be similar to the ones in the step that formed the mark). After further lithographic steps, a finished semiconductor device or other product has been formed on the substrate.

The steps S3-S5 may be performed as discrete steps, or merged into a single larger process. Detector signals may be stored for all marks, and processed to obtain corrected mark positions at a later stage. Mark position measurements may be calculated first for all marks, and corrected later, or corrected measurements may be calculated immediately on measuring each mark.

The calculation of various results in the method described herein will now be explained in detail. A relationship exists between the detector output signals and the positional offsets of the marks. This relationship has the same form for radiation beams having different characteristics. The relationship is a linear relationship. The calculation is based on the observation that measured position depends linearly on the positional offset d between structures and sub-structures, for any given wavelength and/or polarization of radiation used. Ignoring polarization and concentrating on wavelength for simplicity, we assign a value $K(\lambda)$ as a coefficient for this linear dependence. For a sub-segmented mark therefore the following relations hold:

$$X(\lambda) = X_0 + K(\lambda)\Delta d_{ab} + f(\lambda)$$
$$X_0 = X(\lambda) - K(\lambda)\Delta d_{ab} - f(\lambda)$$

Where $X(\lambda)$ is the measured position of a mark as a function of the wavelength of radiation used to illuminate the mark; $X_0$ is the true position of the centre of the periodic structures that form the mark; $K(\lambda)$ is a coefficient for the linear dependence between the positional offset and the measured position of the mark as a function of the wavelength of radiation used to illuminate the mark; $\Delta d_{ab}$ is the positional offset between the structures and the sub-structures of the mark caused by projection errors arising from, for example, optical aberrations; and $f(\lambda)$ is the apparent positional offset between the structures and the sub-structures of the mark caused by substrate processing errors arising from, for example, etching.

$K(\lambda)$ is unknown and depends on many properties of the mark and its overlying and underlying substrate stack. The aim is to find an expression for $K(\lambda)$ and $\Delta d_{ab}$ in order to correct the measured position of the mark $X(\lambda)$ (which is dependent on wavelength and projection errors such as optical aberrations in the process used to form the mark) to a position accurately representing the centre of the periodic structures in a manner which is wavelength and aberration insensitive. $K(\lambda)$ may be thought of as the sensitivity of the measured position of the mark to a positional offset in the mark. Values for $K(\lambda)$ and $\Delta d_{ab}$ may be obtained with the two marks as explained above with reference to FIG. 11 by measuring the positions of different marks having known components of positional offsets in addition to the unknown components of positional offsets. A first mark has a known component of positional offset of $d_-$ and a second mark has a known component of positional offset of $d_+$, so we can write:

$$X_1(\lambda, \chi) = X_0 + K(\lambda)[d_- + \Delta d_{ab}(\chi)] + f(\lambda, \chi)$$
$$X_2(\lambda, \chi) = X_0 + k(\lambda)[d_+ + \Delta d_{ab}(\chi)] + f(\lambda, \chi)$$
$$X_1(\lambda) - X_2(\lambda) = K(\lambda)[d_- - d_+]$$
$$K(\lambda) = \frac{X_1(\lambda) - X_2(\lambda)}{[d_- - d_+]}$$

Where $\chi$ represents the spatial positions (coordinates) of marks on the substrate; $X_1$ is the measured position of the first mark; and $X_2$ is the measured position of the second mark.

An expression for $\Delta d_{ab}$ may be derived by measuring the position of the marks with radiation beams having different wavelengths $\lambda_1$ and $\lambda_2$. For the first mark:

$$X_1(\lambda_1, \chi) = X_0 + K(\lambda_1, \chi)[d_- + \Delta d_{ab}(\chi)] + f(\lambda_1, \chi)$$
$$X_1(\lambda_2, \chi) = X_0 + K(\lambda_2, \chi)[d_- + \Delta d_{ab}(\chi)] + f(\lambda_2, \chi)$$

And for the second mark:

$$X_2(\lambda_1, \chi) = X_0 + K(\lambda_1, \chi)[d_+ + \Delta d_{ab}(\chi)] + f(\lambda_1, \chi)$$
$$X_2(\lambda_2, \chi) = X_0 + K(\lambda_2, \chi)[d_+ + \Delta d_{ab}(\chi)] + f(\lambda_2, \chi)$$

Subtracting the measurement results acquired using the first wavelength from the measurement results acquired using the second wavelength gives a position difference between these two wavelengths for the first mark:

$$X_1(\lambda_1, \chi) - X_1(\lambda_2, \chi) = K(\lambda_1, \chi)[d_- + \Delta d_{ab}(\chi)] + f(\lambda_1, \chi) -$$
$$K(\lambda_2, \chi)[d_- + \Delta d_{ab}(\chi)] - f(\lambda_2, \chi)$$

-continued $$= [K(\lambda_1) - K(\lambda_2)][d_- + \Delta d_{ab}(\chi)] +$$
$$f(\lambda_1, \chi) - f(\lambda_2, \chi)$$

In this equation the term $f(\lambda_1, \chi) - f(\lambda_2, \chi)$ appears. This term represents the difference in the apparent positional offset between the structures and the sub-structures of the first mark caused by substrate processing errors as measured using two different wavelengths of radiation, as a function of spatial position of the substrate.

Performing the same process for the second mark gives a position difference between these two wavelengths for the second mark:

$$X_2(\lambda_1, \chi) - X_2(\lambda_2, \chi) = K(\lambda_1, \chi)[d_+ + \Delta d_{ab}(\chi)] + f(\lambda_1, \chi) -$$
$$K(\lambda_2, \chi)[d_+ + \Delta d_{ab}(\chi)] - f(\lambda_2, \chi)$$
$$= [K(\lambda_1) - K(\lambda_2)][d_+ + \Delta d_{ab}(\chi)] +$$
$$f(\lambda_1, \chi) - f(\lambda_2, \chi)$$

In this equation again the term $f(\lambda_1, \chi) - f(\lambda_2, \chi)$ appears. Recall that the origins of the terms $f(\lambda_1, \chi) - f(\lambda_2, \chi)$ and $\Delta d_{ab}(\chi)$ are different. The term $f(\lambda_1, \chi) - f(\lambda_2, \chi)$ originates from substrate processing errors that arise from, for example, etching and/or CMP. The inventor has noticed that the term $f(\lambda_1, \chi) - f(\lambda_2, \chi)$ gives rise to a lower spatial frequency variation of the measured mark position as a function of spatial position on the substrate compared to the term $\Delta d_{ab}(\chi)$ which originates from projection errors during the formation of the marks such as, for example, optical aberrations. It is expected that the term $\Delta d_{ab}(\chi)$ gives rise to a higher spatial frequency variation of the measured mark position as a function of spatial position on the substrate as compared to the term $f(\lambda_1, \chi) - f(\lambda_2, \chi)$. Additionally or alternatively, it is expected that the term $\Delta d_{ab}(\chi)$ gives rise to spatial variations of the measured alignment position that are associated with a radiation exposure path across the substrate, due to the heating of the projection system as marks are formed along a radiation exposure path across the substrate.

The signals output by the one or more detectors contain information relating to the positions of the marks. The signals comprise constituent parts that have different origins. The signals comprise at least one constituent part that is associated with projection errors such as, for example, optical aberrations present during the formation of the marks. The signals comprise at least one constituent part that is associated with substrate processing errors arising from, for example, etching of the substrate. When the signals are processed, e.g. by a processor, the constituent parts of the signals are discriminated based on a variation of the signals as a function of spatial positions of the marks on the substrate.

Constituent parts of the signals that are associated with the term $f(\lambda_1, \chi) - f(\lambda_2, \chi)$ are known to have what may be considered as being a (relatively) low spatial frequency variation across the substrate. Constituent parts of the signals that are associated with the term $\Delta d_{ab}(\chi)$ are expected to have a (relatively) high spatial frequency variation across the substrate. Additionally or alternatively, constituent parts of the signals that are associated with the term $\Delta d_{ab}(\chi)$ are expected to have spatial variations across the substrate that are associated with a radiation exposure path across the substrate. As explained above with reference to FIG. 5(a), this is due to the projection system absorbing heat from radiation as the marks are formed, leading to varying optical aberrations across the radiation exposure path of the substrate.

The signal discrimination comprises applying statistical analysis techniques such as, for example, principal component analysis, independent component analysis, blind signal separation or polynomial fitting to the signals. Other suitable statistical analysis techniques may be used to discriminate between constituent parts of the signals.

Once the constituent parts of the signals have been discriminated, at least one of the constituent parts is selected and used to calculate a corrected position of at least one mark. The calculation involves exploiting a linear relationship between the positional offset between the structures and sub-structures and the measured position of marks. The linear relationship exists for projection errors. Misallocating substrate processing errors as projection errors results in an error arising in the corrected position of the marks. For this reason, constituent parts of signals associated with projection errors ($\Delta d_{ab}$) are selected and constituent parts of the signals that are associated with substrate processing errors $[f(\lambda_1, \chi) - f(\lambda_2, \chi)]$ are not selected. The method of measuring marks described above involves the discrimination of signals that are associated with different errors, in this example projection errors or substrate processing errors. Therefore the method described herein advantageously avoids the misallocation of substrate processing errors as projection errors, thereby providing an accurate corrected position of the marks. The at least one selected constituent part is used along with information relating to the differences between the known components of the positional offsets of the marks.

Once the at least one constituent part of the signals associated with projection errors has been selected, an expression for the positional offset of the structures and sub-structures of the mark caused by projection errors $\Delta d_{ab}$ may be achieved by dividing the position difference between the two wavelengths for the first mark by the position difference between the two wavelengths for the second mark:

$$\frac{X_1(\lambda_1) - X_1(\lambda_2)}{X_2(\lambda_1) - X_2(\lambda_2)} = \frac{[d_- + \Delta d_{ab}]}{[d_+ + \Delta d_{ab}]} = C$$

$$\Delta d_{ab} = \frac{d_- - Cd_+}{C - 1}$$

If both first and second marks are adjacent to each other, the term $f(\lambda_1, \chi) - f(\lambda_2, \chi)$ will be substantially the same. That is, marks that are proximate to each other on the substrate are expected to have experienced similar substrate processing errors compared to marks that are relatively far away from each other on the substrate, i.e. at such a distance that the substrate processing errors are different at this different locations (see FIG. 6(c)). This is because techniques such as etching or CMP are assumed to have similar effects at proximate positions on a substrate. A validation may be carried out to check that this is assumption is accurate. For example, the marks in the example of FIG. 11 may be in close proximity, so that they may be considered as being at substantially the same location on a large substrate, and may be measured in a single pass of the alignment sensor. In principle, the two marks may be further separated. For example, the two marks may be separated by a distance of several hundred micrometers. Marks separated by a distance of several hundred micrometers may be considered as being adjacent. The validation comprises comparing constituent parts of the signals that were not selected [f($\lambda_1$, $\chi$)−f($\lambda_2$, $\chi$)]. The signals used in the validation originate from radiation diffracted from marks that are proximate each other. The validation provides a useful check to see if an assumption made in relation to the positional offsets of the marks on a substrate is accurate. For example, the assumption that substrate processing errors are associated with what may be considered as being a (relatively) low spatial frequency variation of mark positions measured using different wavelengths of radiation.

Hence the method of measuring the positions of marks described herein provides for calculating a corrected position of at least one mark. Substrate stack information is not required to perform this calculation. The method is independent of the particular type of alignment sensor used, and may be applied with other sensors and not only one based on the self-referencing interferometer shown in FIGS. 3 and 4.

From the above, it is shown how measurements of a position can be made that directly or indirectly measure accurate positions of the periodic structures and sub-structures in a mark, even when an unknown positional offset exists between those positions. This improved measurement can be obtained using different mark patterns, but using position dependent signals existing in the alignment sensor. Some of these signals may for example be position measurements produced using different wavelengths and/or polarizations of position-dependent optical signals detected in the alignment sensor. They may alternatively or in addition be position measurements made using different illumination profiles and/or using different spectral components of the same position-dependent signal.

With reference to FIG. 5(*b*) and FIG. 5(*c*), each "material" region 603 may optionally be formed such that the material 600 is not uniformly present, but is present in a fine pitch grating pattern. This fine pitch grating pattern may, for example, have a periodicity in the Y direction that is into the page, and is therefore not visible in the cross-sections shown in FIG. 5(*b*) and FIG. 5(*c*). This form of mark, having structures sub-segmented in orthogonal directions, is an example similar to those discussed in Megens et al, "Advances in Process Overlay—Alignment Solutions for Future Technology Nodes" in Metrology, Inspection, and Process Control for Microlithography XXI, Proc. of SPIE Vol. 6518, 65181Z, (2007), doi: 10.1117/12.712149.

In another embodiment the general method described above is applied in overlay measurements, in which the accuracy of alignment between (at least) two separate layers on the substrate is measured. For this purpose a scatterometer may be used as described for example in US2011027704 or WO2015062854. The mark is illuminated with at least two different off-axis illumination modes (i.e. at least two different illumination angles with respect to the optical axis) and the scattered radiation is collected by a sensor, such as a CCD or CMOS image sensor. In this example the mark is an overlay target grating which is illuminated completely, i.e. the overlay target grating is overfilled by a measurement spot of the illuminating beam. Optical elements, such as an aperture stop, functions to block the zeroth order diffracted beam so that the image of the mark, in this example the overlay target grating, formed on the sensor is formed only from, e.g., −1 and/or +1 first order diffracted beams. Note that the term 'image' is used here in a broad sense. An image of the grating lines of the mark as such will not be formed on the sensor, if only one of the −1 and +1 first orders is present. In another example of this embodiment of the invention, on-axis illumination of the overlay target gratings may be used, and an aperture stop with an off-axis aperture is used to pass substantially only one of the −1 and +1 first orders of diffracted light to the sensor. In yet other embodiments, second, third and higher order beams can be used instead of or in addition to the first order diffracted beams.

In an embodiment the overlay error between two layers containing two or more overlay target gratings is measured through asymmetry of the gratings, by comparing the intensities in the +1 and −1 first order dark field images. An image of the overlay target gratings is obtained using only one of the first order diffracted beams, for example the −1 first order. Then, whether by changing the illumination mode, or by changing the imaging mode, or by rotating the substrate by 180° in the field of view of the apparatus, a second image of the overlay target gratings using the other first order diffracted beam, for example the +1 first order, is obtained. Consequently the +1 first order diffracted radiation is captured in the second image. The first and second images of all the overlay target gratings are captured via the image sensor.

Note that, by including only half of the first order diffracted radiation in each image, the 'images' referred to here are not conventional dark field microscopy images. Each overlay target grating will be represented simply by an area of a certain intensity level. The individual overlay target grating lines will not be resolved, because only one of the +1 and −1 first order diffracted radiation is present.

Having measured the intensity for each individual overlay target grating, the asymmetry of the grating structure, and hence overlay error, can then be determined. This is done by an image processor and controller that are arranged to compare the intensity values obtained for +1 and −1 first orders for each overlay target grating in order to identify any difference in their intensity.

The invention as described above for the alignment mark embodiments can be similarly applied for overlay target gratings by programming known positional offsets in the overlay target gratings. In this case, however, the intensities of images obtained from different diffraction orders are compared instead of different wavelengths in the embodiments described above in relation to the alignment marks. Thus, in this overlay embodiment, the signals are intensity signals as detected by the image sensor. Similarly, in this overlay embodiment the constituent signals are discriminated based on a variation of the signals as a function of the spatial position of the overlay target gratings on the substrate. Thus, the method as described with respect to the flowchart of FIG. 12 applies equally to this overlay embodiment, but then applied to the overlay target gratings and detecting asymmetry in the intensity signals originating from different diffracted orders of the measurements beam(s) instead of signals originating from the measurement beam(s) with different wavelengths.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the lithographic apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of determining positions of marks on a substrate, the marks comprising structures arranged periodically in at least a first direction, at least some of the structures comprising periodic sub-structures, the sub-structures having a smaller period than the structures, the marks being formed with positional offsets between the sub-structures and the structures, the positional offsets being caused by a combination of both known and unknown components, the method comprising:

illuminating a plurality of the marks with radiation;

detecting radiation which is diffracted by the marks and which has different characteristics, using one or more detectors which produce output signals;

processing the signals, wherein the processing comprises discriminating between constituent parts of each of the signals, the discriminating being based on a variation of the signals as a function of spatial positions of the marks on the substrate;

selecting at least one of the constituent parts of the signals that represents a higher spatial frequency variation in measured positions of the marks as a function of spatial positions of the marks on the substrate than a constituent part that is not selected; and using the at least one selected constituent part, and information relating to a difference between the known components, to calculate a corrected position of at least one mark.

2. The method of claim 1, further comprising performing a validation, the validation comprising comparing constituent parts of signals that were not selected, the signals originating from radiation diffracted from marks which are adjacent to each other.

3. The method of claim 1, wherein the processing comprises applying principal component analysis or independent component analysis or blind signal separation or polynomial fitting, to the signals.

4. The method of claim 1, wherein the calculation uses a relationship between the output signals and the positional offsets of the marks.

5. The method of claim 4, wherein the relationship has the same form for radiation having different characteristics.

6. The method of claim 4, wherein the relationship is a linear relationship.

7. The method of claim 1, wherein the different characteristics of the diffracted radiation are provided by illuminating the plurality of marks with radiation comprising different wavelengths or different polarizations.

8. The method of claim 1, wherein the different characteristics of the diffracted radiation are provided by illuminating the plurality of marks with different off-axis radiation beams and/or by detecting different diffraction orders.

9. The method of claim 8, wherein the one or more detectors comprises an image sensor.

10. The method of claim 1, wherein at least one selected constituent part of the signals comprises a constituent part of the signals with spatial variation associated with a radiation exposure path across the substrate.

11. A lithographic apparatus comprising:
a patterning subsystem configured to transfer a pattern to a substrate;
a measuring subsystem configured to measure positions of the substrate in relation to the patterning subsystem, wherein the patterning subsystem is arranged to use the positions measured by the measuring subsystem to apply the pattern at a desired position on the substrate and wherein the measuring subsystem is arranged to position the applied pattern by reference to measured positions of marks provided on the substrate and wherein the measuring subsystem is arranged to calculate the measured positions of the marks by the method as claimed in claim 1.

12. A method of manufacturing devices wherein a device pattern is applied to a substrate using a lithographic process, the method including positioning the applied pattern by reference to measured positions of one or more marks formed on the substrate, the measured positions being obtained by the method as claimed in claim 1.

13. A non-transitory computer program product comprising machine-readable instructions therein, the instructions, upon execution by a processing device, configured to cause the processing device to at least:
obtain signals that correspond to detection of radiation, diffracted by marks on a substrate, having different characteristics, the marks comprising structures arranged periodically, at least some of the structures comprising periodic sub-structures, the sub-structures having a smaller period than the structures, and the marks formed with positional offsets between the sub-structures and the structures, the positional offsets caused by a combination of both known and unknown components; discriminate between constituent parts of each of the signals, the discriminating based on a variation of the signals as a function of spatial positions of the marks on the substrate and at least one constituent part representing a different type of error in physical manufacturing or processing of the marks than another at least constituent part;
select at least one of the constituent parts of the signals; and
use the at least one selected constituent part of the signals, and information relating to differences between the known components, to calculate a corrected position of at least one mark.

14. A non-transitory computer program product comprising machine-readable instructions therein, the instructions, upon execution by a processing device, configured to cause the processing device to at least:
obtain signals from one or more detectors, which signals correspond to detection of radiation, diffracted by marks on a substrate, having different characteristics, the marks comprising structures arranged periodically, at least some of the structures comprising periodic sub-structures, the sub-structures having a smaller period than the structures, and the marks formed with positional offsets between the sub-structures and the structures, the positional offsets caused by a combination of both known and unknown components;
process the signals, wherein processing of the signals comprises discriminating between constituent parts of each of the signals, the discriminating based on a variation of the signals as a function of spatial positions of the marks on the substrate;
select at least one of the constituent parts of the signals that represents a higher spatial frequency variation in measured positions of the marks as a function of spatial positions of the marks on the substrate than a constituent part that is not selected; and
use the at least one selected constituent part, and information relating to a difference between the known components, to calculate a corrected position of at least one mark.

15. The computer program product of claim 14, wherein the instructions are further configured to cause the processing device to perform a validation, the validation comprising comparison of constituent parts of signals that were not selected, the signals originating from radiation diffracted from marks which are adjacent to each other.

16. The computer program product of claim 14, wherein the calculation uses a relationship between the output signals and the positional offsets of the marks.

17. The computer program product of claim 16, wherein the relationship has the same form for radiation having different characteristics.

18. The computer program product of claim 17, wherein the relationship is a linear relationship.

19. The computer program product of claim 14, wherein the different characteristics of the diffracted radiation are provided by illuminating the plurality of marks with radiation comprising different wavelengths or different polarizations, by illuminating the plurality of marks with radiation comprising different off-axis radiation beams, and/or by detecting different diffraction orders.

20. The computer program product of claim 14, wherein at least one selected constituent part of the signals comprises a constituent part of the signals with spatial variation associated with a radiation exposure path across the substrate.

21. An apparatus comprising:
an optical system configured to illuminate a plurality of marks on a substrate with radiation, and detect radiation which is diffracted by the marks using one or more detectors which produce signals; and
the non-transitory computer program product of claim 13.

* * * * *